(12) United States Patent
Roser

(10) Patent No.: US 12,458,847 B2
(45) Date of Patent: Nov. 4, 2025

(54) AMPHIBIOUS EXOSKELETON PROPULSION FOOTWEAR

(71) Applicant: Mark Costin Roser, Hebron, CT (US)

(72) Inventor: Mark Costin Roser, Hebron, CT (US)

( * ) Notice: Subject to any disclaimer, the term of this patent is extended or adjusted under 35 U.S.C. 154(b) by 0 days.

(21) Appl. No.: 18/612,597

(22) Filed: Mar. 21, 2024

(65) Prior Publication Data

US 2024/0278074 A1    Aug. 22, 2024

Related U.S. Application Data

(63) Continuation of application No. 17/368,809, filed on Jul. 6, 2021, now Pat. No. 11,964,190.

(51) Int. Cl.
*A63B 31/11* (2006.01)

(52) U.S. Cl.
CPC ......... *A63B 31/11* (2013.01); *A63B 2031/112* (2013.01)

(58) Field of Classification Search
CPC ... A63B 31/11; A63B 2031/112; A63B 35/00; A63B 2220/12; A63B 2230/00; A63B 31/12
USPC .............................................. 441/60, 61, 62
See application file for complete search history.

(56) References Cited

U.S. PATENT DOCUMENTS

| | | |
|---|---|---|
| 8,438,757 B2 | 5/2013 | Roser |
| 9,282,783 B2 | 3/2016 | Roser |
| 9,572,395 B2 | 2/2017 | Roser |
| 10,111,490 B2 | 10/2018 | Roser |
| 11,234,482 B2 | 2/2022 | Roser |
| 11,964,190 B2 | 4/2024 | Roser |
| 2010/0075554 A1 | 3/2010 | Johnson |
| 2022/0110412 A1 | 4/2022 | Roser |
| 2023/0010581 A1 | 1/2023 | Roser |

FOREIGN PATENT DOCUMENTS

| | | |
|---|---|---|
| WO | WO 2004/091735 A1 | 10/2004 |
| WO | WO 2016/094930 A1 | 6/2016 |

*Primary Examiner* — Anthony D Wiest
(74) *Attorney, Agent, or Firm* — Wolf, Greenfield & Sacks, P.C.

(57) ABSTRACT

Embodiments of footwear to optimize propulsion while swimming in the water and walking on land, in particular, amphibious footwear capable of duty on land and in the water as well as versions that are optimized for predominantly use in the water for swimming. The exoskeleton amphibious footwear reduces metabolic demand of walking and swimming while also improving gait speed and swim speed. This is accomplished by assisting plantar flexion during land mode, and assisting dorsiflexion in water mode.

25 Claims, 19 Drawing Sheets

Fig. 1F
Fig. 1G
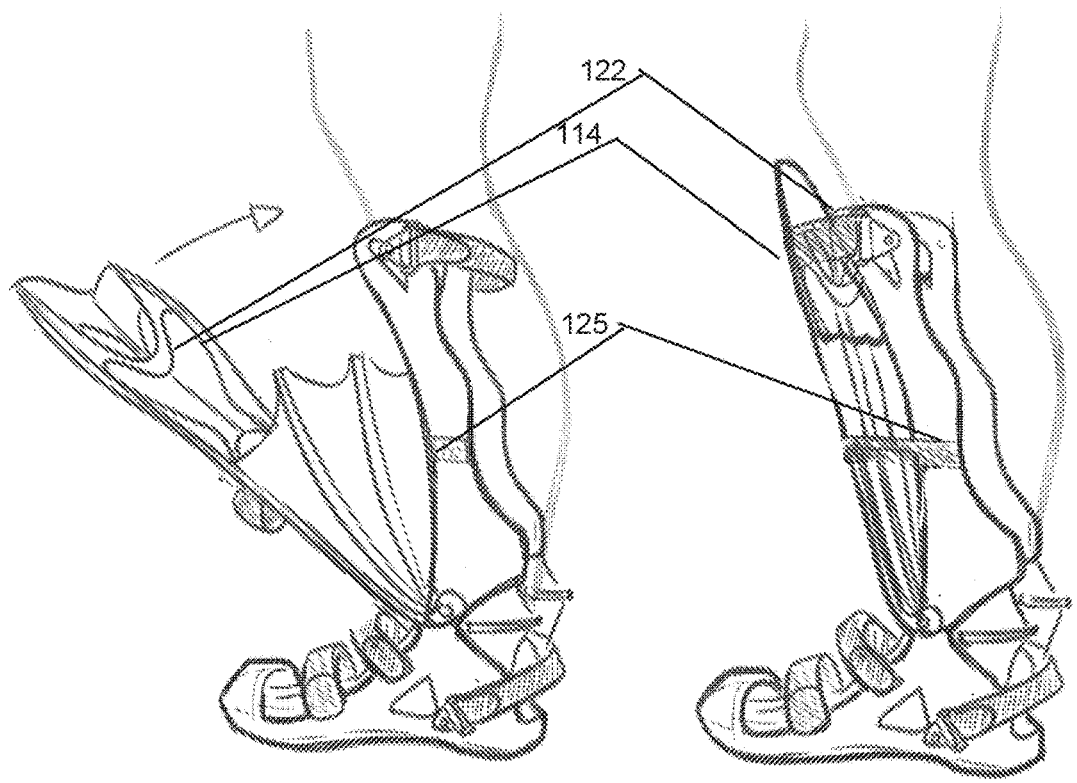
Fig. 1H
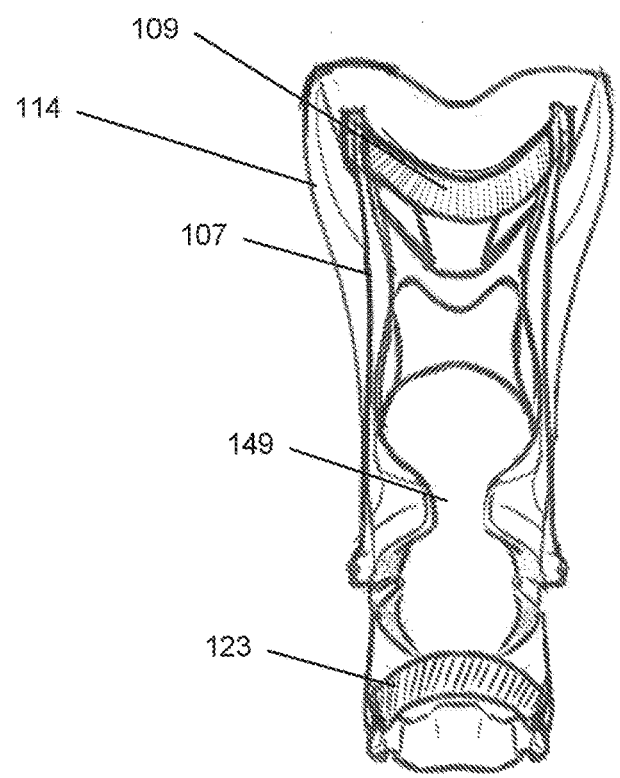

Fig. 1I
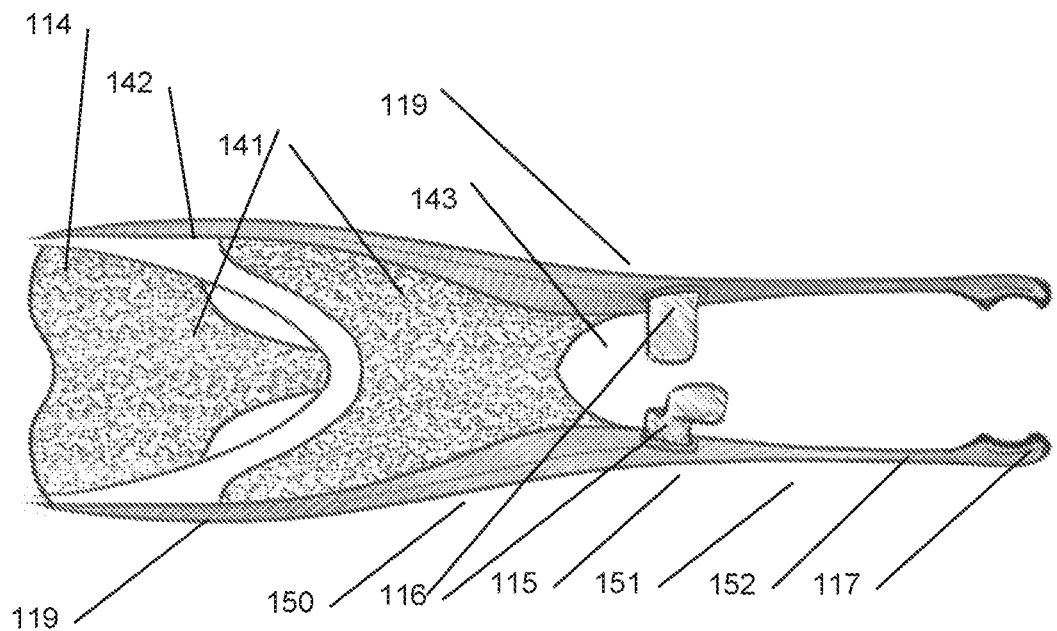
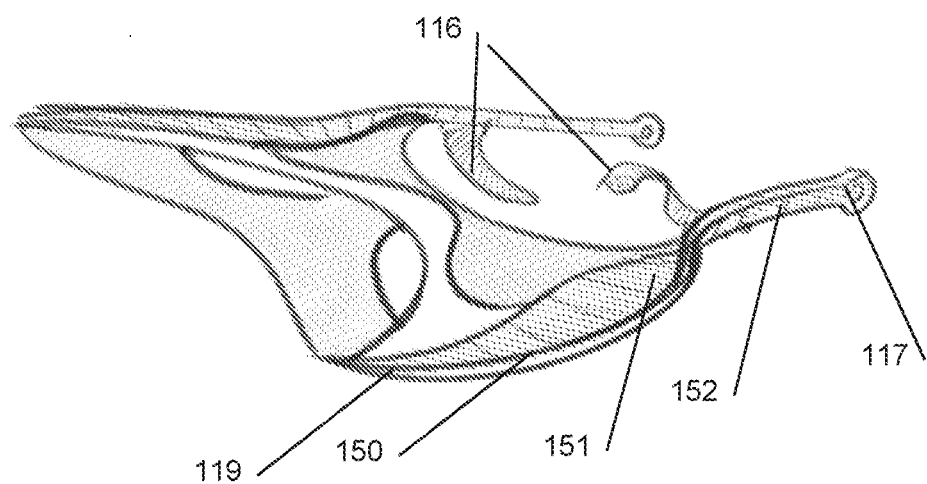
Fig. 1J

721

721

AMPHIBIOUS EXOSKELETON PROPULSION FOOTWEAR

CROSS-REFERENCE TO RELATED APPLICATIONS

This application is a Continuation of U.S. application Ser. No. 17/368,809, filed Jul. 6, 2021, entitled "AMPHIBIOUS EXOSKELETON PROPULSION FOOTWEAR". The entire contents of which is incorporated herein by reference in its entirety.

FIELD OF THE DISCLOSURE

The technical field relates to devices of amphibious footwear for improving the efficiency and performance of human motion on land and in the water.

BACKGROUND

When swimming, running, jogging, walking, leaping or lunging, it is often desirable to do so with greater performance and/or reduced effort. It is also desirable to prevent pain, reduce the likelihood of foot/leg/joint problems, and to protect the foot from ulceration and amputation.

When on land, it is common to wear footwear—which may include shoes, boots, socks, sandals, among a wide variety of other items which may cover portions of the foot as well ankle and sometimes lower leg.

When in the water, it is common for divers, snorkelers and swimmers to use flippers to augment their leg propulsion and increase the efficiency of swimming.

Plantar flexion (PF) of the ankle is powered by calf muscles—the Soleus and Gastrocnemius, which involve the Achilles Tendon. Dorsiflexion (DF) of the ankle is managed by muscles including the tibialis anterior, extensor hallicus longus, extensor digitorum longus, and peroneus teritus and involve the flexor tendons.

Motion on Land

Land based locomotion of walking and running follows a gait cycle. After foot strike, stance phase begins and the center of mass passes over the midline and the leg dorsiflexes. The dorsiflexion extends the Achilles tendon. After the ankle reaches maximum dorsiflexion, the heel lifts off the ground and propulsion is delivered through plantar flexion of the ankle joint. Propulsion phase ends when the toe leaves the ground, which begins the swing phase.

Ankle power is required after foot strike and during dorsiflexion to maintain stability, postural control and symmetry; this results in work being performed—known as negative work. Ankle power is also required during the propulsion phase of gait during plantarflexion prior to toe-off and results is known as positive work.

Augmenting the plantar flexion of the ankle/foot can be beneficial to gait. As shown in clinical studies, the deployment of a spring-activated ankle/foot exoskeleton can improve walking gait speed in both people with diabetic foot ulcer as well as normal healthy individuals. It is also shown to concurrently reduce plantar pressure in the metatarsal region of the foot.

An ankle foot exoskeleton can reduce negative work while also reducing positive work required for a person to walk at the same speed, or it may augment performance or both.

Thus—ankle foot exoskeletons have the ability to improve land based gait by delivering a supplemental plantar flexion propulsion power by establishing a supplemental tension device in parallel to the Achilles tendon. This supplemental tension may be supplied by a passive spring type of system or a power actuated system.

Swim Motion

The act of swimming and imparting propulsive force through the feet or feet with flippers often includes a flutter kick which includes up and down leg motion to drive the feet or flippers. This motion can be done bipedally with each leg in an opposite cycle, unipedally with both legs working in tandem on the same cycle, or a combination of the two (eg—the combat side stroke). When swimming with the face down using a flutter kick, there is downward stroke and an upward stroke of the legs.

Pinipeds and dolphins have optimal tail muscle composition to provide propulsion in both up and down strokes. The upstroke is driven by their epaxial muscles, and the downstroke is driven by the hypaxial muscles. The human muscle structure, however, is adapted toward land propulsion and is not optimized for the biomechanics of swimming, especially at the lower leg.

The lower leg muscles required for the important downstroke propulsion are in the shin area (tibialis anterior, extensor hallicus longus, extensor digitorum longus, and peroneus teritus).

These muscles are not associated with propulsion while walking—they are more responsible for lifting the foot while walking, balance, stability and foot placement. Because of this, they are weak when compared to the calf.

Observing the biomechanics of the lower limb during the flutter kick downstroke—it begins on each leg (separately with flippers and together with a monotail) with hip flexion, followed by knee extension, and concluded by ankle/foot dorsiflexion. The upstroke of the flutter kick begins with hip extension, followed by knee flexion and ankle/foot plantar flexion. A similar motion of both limbs in harmony is noted with a monofin, which is cited in records of swimming speed as being faster than dual fins The majority of propulsion occurs during the down stroke. This is easily viewed in video recordings of swimmers from the side. In such videos, the deflection of the blade element of the flipper is greater and of longer in the down stroke than the up stroke, revealing the intensity and duration of propulsion power. The down stroke has a higher degree of power input into the water, and the duration of that power input is longer than the power input of the up stroke. Therefore, a majority of leg-based propulsion from flutter kick swimming and finning is the result of the down stroke.

The power of the down stroke relies significantly on the dorsiflexion power of the ankle joint. Strong dorsiflexion exertion of the ankle extensor tendons and muscles is not typically required during walking and running on land. As such, they are weaker than the calf muscles and Achilles tendon.

These muscles are the rate limiting factor in swim propulsion. By using an exoskeleton to augment these weaker muscles, one can significantly increase swim velocity while reducing metabolic effort, fatigue, cramping and post swimming discomfort.

Having to engage these muscles responsible for dorsiflextion (the tibialis anterior, extensor hallicus longus, extensor digitorum longus, and peroneus teritus) required for swimming and finning can be uncomfortable. These muscles are rarely used for any significant load on land—and using them for swimming makes them vulnerable for soreness and pain; these muscles can also become fatigued and lack sufficient strength to deliver desired levels of propulsion, especially over time.

Another source of discomfort is spending extended time with the feet in the plantar flexed position (with toes pointed) while swimming and finning. This shortens the calf muscles making them vulnerable to cramping. Similarly, the recuperation of the dorsiflexion muscles and tendons can lead to cramping in the hours and evening and days after swimming.

When analyzing the muscular power of various ankle/foot muscles, one can look to data gathered from an isokinetic dynamometer. In studies of people analyzed in an isokinetic dynamometer, people often demonstrate a maximum plantar flexion joint torque in the order of 50 to 150 newton-meters. Contrast this with dorsiflexion torque, in which the maximum torque is measured at only 10 to 40% of the plantar flexion. Thus the plantar flexor system is much stronger than the dorsiflexor system. Thus, the human lower limb is not optimized for swimming, but for land locomotion.

Furthermore, when evaluating the muscle power of the ankle muscles (gastroc/soleus)—one can measure their torque at various joint angles. What is clear is that the maximum torque can be exerted when the ankle joint is closer to neutral. The ankle joint is at its least able to exert torque when the ankle joint position is fully plantar flexed or fully dorsiflexed. This implies that swimming with the toes pointed and the ankle near fully plantar flexed, that the calf muscles are operating in a sub-optimized position. Swimmers would be able to deliver increased propulsion if their ankle joint was closer to the neutral position.

Propulsion of swimming and finning can be optimized by deployment of an ankle foot exoskeleton that enables augmented contribution of the plantar flexor system, and by reducing the amount of plantar flexion angle during propulsion.

Introduction to the Swim Aspects of the Present Invention

The present invention teaches a simple approach to overcome this lack of optimization, by employing the calf muscles and Achilles tendon to stretch a spring element during the plantar flexion motion of the upstroke, so that at the end of the upstroke, there is potential energy in the spring element. In this way, potential energy in the spring may be released during the downstroke and dorsiflexion, augmenting or replacing some of the force from the ankle/foot dorsi flexor muscle group.

Swimming with the device requires that a user must exert additional plantar flexion force during the upstroke beyond the typical force required by a flipper without an exoskeleton. The time duration of this additional plantar flexion force consumes more than half of the stroke cycle, implying that the integral of exertion is gradual and therefore it is comfortable and does not feel like additional work. Because the calf muscles have so much more PF capacity than is required by swimming, it does not require significant additional metabolic demand.

At the end of the up stroke, the user remains in plantar flexed position into the initial phase of the down stroke. The latter phase of the down stroke, the user dorsiflexes to impart propulsion into the flipper. This dorsiflexion motion occurs more rapidly than plantarflexion and establishes a whip-like motion at the tip of a flipper blade, generating significant propulsion. Spring elements can snap back at a rapid rate, augmenting not only the amount of force with which the body can dorsiflex the flipper blade, but also accelerate the speed at which the flipper blade is dorsiflexed and whipped. Therefore, the intensity of the spring return contributes rapidly and significantly to propulsion dorsiflexion motion of the foot.

For example, imagine a tension spring anchored to a flipper element near the bottom of the foot near the toes and also at an anchor point on a yoke positioned near the mid-to-top of the shin (or calf) area. Such a stretched spring element would induce/assist dorsiflexion. Imagine during the upstroke of the flutter kick that the user had a 50 degree rotational range of ankle/foot motion as measured by goniometry. If a spring with a 0.5 pound per degree spring rate were deployed, then a peak force of 25 pounds would develop in the spring. Upon transition from upstroke to downstroke, the spring would exert the 25 pound force to initiate the dorsiflexion motion and contribute to the dorsiflexion force and accelerate the dorsiflexion rotational speed. If the user normally exerted 10 pounds of dorsiflexion force, they could allow the spring to augment their force to 35 pounds, or they could simply allow these muscles to relax and have the spring exert the force of 25 pounds and do all of the DF work for them.

In this way, the surplus plantar flexion capacity of the calf muscles, that is underutilized during the upstroke PF motion of the flutter kick may be engaged by loading an exotendon spring during plantar flexion of the upstroke with minor additional effort (relative to walking/running). And, that the release of this stored energy will have highly significant impact on the dorsiflexion force and rotational velocity of the downstroke. These benefits may be noticed during swimming in terms of faster swimming speeds, lower overall exhaustion after swimming, the reduction of muscle cramping and discomfort during use, and the reduction of muscle cramping and soreness after use.

The geometric design of the flipper blade and its geometric angle of attack can further support these benefits. There is a risk of discomfort during swimming and cramping after swimming as a result of spending too much time with the ankle/foot fully plantar flexed (eg: at around 50 degrees of PF). Designing flippers so that the pitch angle of the blade of the flipper is angled downward relative to the flat bottom plantar surface of the foot allows the flipper to be streamlined when the ankle/foot is not fully plantar flexed (eg: 30 to 40 degrees). The other benefit to this pitch angle is that the body has increased joint torque capacity in the ankle/foot for both dorsiflexion and plantar flexion when the ankle is closer to the neutral position. As such, the flipper—spring combination mentioned above may be further improved by biasing the pitch angle of the blade(s) downward to enable streamlined flow without the foot at full plantar flexion.

Introduction to the Amphibious Design Elements of the Present Invention

The present invention relies upon plantarflexion augmentation during land motion, and dorsiflexion augmentation during swim motion.

Augmenting plantar flexion and dorsiflexion can be efficiently deigned by establishing spring force anchor zones above and below ankle joint. For the land based plantar flexion augmentation system, the anchor below the ankle joint can be set proximal to the posterior heel area, and the anchor above the ankle can be set posterior to the ankle joint on the aft portion of a yoke stanchion. The radial distance from the ankle joint center of sagittal plane rotation to the tension unit would establish a moment arm to help determine torque. Positioning a tension spring further from the ankle joint axis increases such torque.

Force from the front of the leg could be delivered into a shin strap that is attached to an anchor zone. Said anchor zone could be part of the same yoke stanchion. In this way—force from the leg can be imparted into the stanchion—that would then be directed into the hinge and the spring element.

Attached to this would be a base unit that could accept the force in the hinge and its own aft anchor for the said spring element—which would induce a reciprocal plantar flexion torque in the base unit. In this way—plantar flexion can be augmented.

For swim based propulsion, dorsiflexion power is augmented. A flipper element can be deployed on a hinge, so that it can drive propulsion. In swim mode, lifting torque in the dorsiflexion direction is imparted by the spring element in relation to the rotation of the hinge along the axis of ankle joint rotation in the sagittal plane. The spring element could be anchored below the ankle joint proximal to the toe region of the foot and flipper while the spring element could be anchored above the ankle to a yoke stanchion proximal to the top of the calf. Thus—a torque can be created between the hinged flipper and yoke elements. The yoke stanchion would require an element such as a leg strap or other cross member behind the calf muscle to establish a secure location against which the torque can be established so that the flipper can be lifted—thereby inducing a dorsiflexion torque.

A base unit would be required to establish a secure means for managing the hinge for the flipper and the hinge for the yoke stanchion. These two hinges are preferably coaxial, and aligned with the ankle joint, but may have separate axis locations in close proximity to each other and the axis of the ankle joint. These hinges must withstand forces in multiple directions, and the base unit is able to maintain their position co-axial to the ankle joint axis of rotation. The base unit can be integral to a reinforced shoe, sandal, boot, or other footwear. Or the base unit can be in an independent unit that inserts into footwear.

In swim mode, the flipper rotates in alignment with the foot. A foot strap helps accomplish this, and the hinge of the flipper being aligned with the ankle joint reduces unwanted chaffing between the foot strap and foot during rotation. This range of motion during swimming can range from less than 20 degrees to more than 50 degrees. Prior to entering the water, it is also desirable for a wearer also to stand up with water-based amphibious mode engaged—implying a total system range of motion of up to 70 degrees or more. It is also envisioned that the flipper can be rotated up to stow adjacent to the shin when it is not in use—for example, during land mode—in which it will be both out of the way and serving as a shin guard. This implies that the amphibious flipper must have a total range of motion of over 180 degrees.

Stanchion Options

There are multiple embodiments to the stanchion design in the present invention. In the embodiment described above a single yoke stanchion (disposed on both medial and lateral sides) provides anchors for both the PF and DF springs, and provides anchors for at least one leg strap positioned above the ankle. As mentioned earlier—in this preferred embodiment, the PF spring would be anchored aft of the ankle, preferably within 0 to 5 cm elevation above the ankle joint and 2 to 12 cm distance behind the ankle joint. When the elevation of the PF spring anchor is too high, there is a risk of augmenting inversion and eversion joint torques as viewed from the frontal plane, and as such any tension in this manner would serve to augment untoward inversion and eversion forces around the ankle joint. By keeping the anchor point of a tension spring lower, it reduces the likelihood of augmenting inversion and eversion forces and can be positioned to help counteract inversion and eversion joint forces and provide ankle sprain protection.

In some alternative embodiments, the flipper can serve two major functions—as both a flipper during swim mode and at least one stanchion for plantar flexion augmentation in land mode. In this alternative embodiment, at least one spring element would be attached to the flipper and engaged when the flipper was stowed along the shin in land mode. Such a spring could serve dual purpose of also being attached to the heel of the base providing PF augmentation, while also helping to secure the flipper to the leg and maintain it in a stowed position adjacent to the shin. In this way, such a PF spring could act independently and provide the full amount of PF assist, or it could be disposed in cooperation with a separate PF spring attached to the yoke stanchion and heel of the base.

Sole Lattice Integration Options

In another embodiment, an objective is to use the spring tension in the spring element as an input to a sole lattice. For example, as tension in the PF spring element increases, it will increase the load on its base anchor. If the base anchor is attached to the sole lattice structure, the tension in spring element can alter the performance of the sole lattice. This can be valuable, for example, in using dorsiflexion and plantar flexion to influence the performance of the sole area under the foot and change its dynamics in relation to the specific portion of the gait cycle.

Accessory Drive Options

In another embodiment, an objective is to use the spring tension as an input to an accessory device. For example, the DF spring could be anchored to a device that could serve as both a secure anchor point, as well as an accessory drive unit, such as a diaphragm pump. Such a pump could provide circulation of liquids or establishment of a vacuum to remove excess water from areas into where it had leaked.

Flipper Blade History

For the sake of clarity, the term blade is used herein as a general term to describe the surface area of the forward (distal) end of a flipper which is used to generate hydrodynamic forces for swim propulsion. Said propulsion may be generated by a vast combination of geometric, hydrodynamic and curvilinear surface areas, shapes and surface treatments to generate hydrodynamic propulsion at optimal efficiency while reducing unwanted drag, air bubbles and noise signatures.

In a traditional flipper, an elastomeric such as cast rubber is used, with a typical width of approximately 7 inches and a flipper surface area that extends 10" in front of the toes of the user. There are many different material options for executing the blade surface area of the flipper. The blade surface is also commonly executed in plastics, urethanes, nylons, rubber of various types, fiberglass, carbon fiber, and many other semi-rigid elements and combinations of such materials. The majority of commercially available flippers are cast in a molding process, such as injection molding, co-molding, and other manufacturing techniques. Some high performance flippers use sheets of carbon fiber designed to the preferred bending stiffness and angle. Some flippers have full foot pockets at the forefoot and heel, while some only have a forefoot cavity and a heel strap, or some combination thereof.

Powered Actuators

The use of springs without supplemental power in an exoskeleton is typically referred to as a passive exoskeleton. While the present application describes its preferred embodiment as a passive exoskeleton, it may also be executed as a powered exoskeleton. In a powered configuration, the PF and or DF actuation would be augmented by supplemental power. For example by the use of a linear actuator in series or parallel to the PF and or DF spring elements. The actuation could also be delivered by rotating actuator aligned with the ankle joint. Linear actuation can be delivered via a variety of mechanisms and power sources. One power source example is battery that could power a solenoid. Another power example is a compressed air tank frequently used for SCUBA, which could also power a pneumatic piston.

Sagittal Plane Blade and Sidewall Bending Moments

In some designs, the nominal blade thickness and blade material establishes the blade rigidity. This is true with many high performance carbon fiber blade designs that are popular with free divers and can be more than 60 cm in length. In other designs, rigidity if aided through deployment of medial and lateral side rails to augment structural rigidity. Yet other designs have cross-members to help manage sagittal plane blade and sidewall bending. Such blade surfaces, side rails and cross members are designed to establish both a means of connecting joint torque of the foot to motion of the blade, while also ensuring sufficient rigidity to prevent buckling with sufficient elastomeric softness to provide comfort and efficiency.

Sagittal plane bending of the sidewalls and blade allows for the time duration of propulsion to be extended, similar to gearing-down a motor in a car, thereby reducing torque to accomplish similar work. Said flexibility therefore must be tuned to match the anticipated swim stroke frequency, the anticipated torque of the swimmer the blade length of the flipper, the geometric shape of vents in the flipper blade area, the impact of multiple elements of different materials in the blade area, the angle of attack of the blade relative to the plantar foot surface, and other hydrodynamic and biomechanical factors. Speaking in general terms, stronger swimmers generate more torque in the blades require stiffer overall system construction and can manage larger fin surface areas. Weaker swimmers generate less torque and benefit from softer overall system construction. Swimmers who have slower strokes require softer overall construction while swimmers with faster strokes require stiffer construction. Free divers who spend extended time under water without supplemental oxygen often have very long 50 cm+ flippers and powerful but slow finning motion to maximize metabolic efficiency of swimming, and often use flippers of carbon fiber blades with relatively no sidewalls other than to protect the sides of the carbon fiber.

The addition of a DF assisting spring or spring and powered actuator combination would increase the torque delivered into the unit, thereby allowing designers to combine the variables of blade bending stiffness, blade length, blade width, number of blades, angle of attack of the blades, and other hydrodynamic and biomechanical factors to optimize swim performance, foot and leg comfort, ankle stability, hydrodynamic efficiency, mission requirements, noise signature, sonar signature, and aesthetics.

Multiple Flipper Blade Options

There are some situations where long flipper blades may not be desired—for example when walking on land or a boat prior to entering the water, when exiting the water, when needing to have one's feet on the sea floor bottom or while diving in tight confines (such as a cave or ship wreck). In these cases, there is benefit in stacking multiple shorter blades on top of each other. This is done in biplanes and modern Formula race car wings, where 5 or more wings are stacked.

Such multiple blades can be made in a way that allows them to be part of linkages which collapse when not in use and erect when in use. For example, having more than one flipper blade element on the hinge, attaching two bars on pivots to the main flipper blade and a supplemental blade can create a four bar linkage that can be rotated into place and then lay flat.

There is also benefit in making the angle of attack of such blades variable and user adjustable to tune the performance of the blade propulsion to the desired level—similar to the gear ratio of a car transmission.

Fold Out Flipper Blade Options

There are certain situations in which a long flipper blade is desired, but the desired length would not fit well during stowage along the shin. A 12" blade can rotate up along the shin and stow under the knee and out of the way. Having a fold-out member of 6" in length would allow the user to unfold the final 6 inch segment when deployed in the water, extending the total length to 18° with the axis of the medial and lateral hinge rotation being parallel to the ankle joint axis. This can be executed with hinges and stops on medial and lateral sides. This can also be envisioned by the use of telescopic side rails. It can be envisioned through the use of axial hinges on each side rail to allow fold-out of flipper to extend width of the blade surface, and others. The surface area may also be expanded laterally by additional fold-out wings, or by orienting all or part of the side rails to be wider at their distal end.

Base Unit Options

The proposed invention can be designed to meet a variety of use cases. In some use cases, performance for military deployment with an emphasis on ground maneuvering would need to be optimized, implying that the base unit would be integral to a shoe or boot that was suitable for the temperature and environmental conditions required. In some cases, low cost may for children or snorkeling tourists might be optimized, implying that the base unit might be similar to today's commercially available foot holding element of flippers. In some cases free-diving requirements might drive a design that has a very strong means of securing a sandal-type base unit to the foot such that it is fully secure while under significant loading from very large flippers and powerful swimmers. All of these types can be executed by one skilled in the art.

For military engagements, one can imagine a deployment with entry to the theatre of action via one to two miles of swimming, followed by several miles of hiking without a planned return to swimming. In this case, one can imagine a use case in which the flipper unit could be easily and rapidly detached from the foot strap, detached from the hinge, and detached from the DF spring element. In this way the flipper elements no longer run the risk of interference or being trip hazards. Similarly, the opposite may be true in which operators deploy via parachute, conduct operations and depart by swimming, implying a need for fold-down flippers or flippers that can be stowed in a backpack with minimal weight and volume.

Swim-Only Options

In some cases, users may simply want high performance flippers for swimming and may not wish to pay for any amphibious features. In this case, a dedicated swim unit would not require PF augmentation and may not require full retraction of the flipper blade when not in use. This unit would not have downward prevailing force on the hinge unit and therefore would not require a semi-rigid base or semi-rigid sidewalls and the base unit could include more elements that are flexible.

One approach envisions the base, flipper, and leg rails as part of a single element if desired. This type of embodiment may help reduce manufacturing, component and material cost and is fully covered by the teaching of this application.

Modular Options

It can also be envisioned that the device could be made in modules, such that the user might swim one day with a flipper module and no exotendon, but then enable or attach the leg rails, hinge unit, spring, leg strap, etc and have a fully functioning exotendon flipper the next usage.

Combining with Existing Flippers

Many people have existing flippers and prefer to continue using them for sentimental or cost reasons. This invention teaches the configuration of the exotendon components to enable increased propulsion in existing flippers. This may be accomplished by establishing a lifting force proximal to the toe region of the existing flipper, supported by an anchor behind the user's leg. In a simple embodiment, a hinged pair of side rails and vertical leg rails (leg yoke stanchions) are connected to each other by a hinge, and to the leg and foot by straps, enabling the suspension of a tension spring forward of the ankle to augment dorsiflexion.

Combining with Wet-Suits and Dry Suits

It is conceivable that users may wish to integrate their wetsuit or drysuit to better accommodate a leg yoke stanchion. For example, a passageway or pocket could be integrated into the wet or dry suit to enable full performance of the wet or dry suit to protect the body while providing appropriate space for the yoke, hinge, and tension spring unit. A separate set of straps on the wet or dry suit would facilitate attachment of the leg straps and would facilitate stowage of the flipper when not in use. The spring elements could also be integrated into the design of the legs of the wet or dry suit material as well.

Combination with Knee Extension Augmentation

It is also envisioned that a user may wish to augment knee extension for swimming and land based performance improvement. In one embodiment of such a design, an exotendon can be supported in front of the knee axis of rotation, anchored above and below the knee, providing elastic bending resistance away from neutral position to encourage return to the neutral position. In such a configuration, one approach is to use the leg stanchion to provide appropriate positioning for a below-knee anchor in front of the knee. An anchor above the knee could be attached to the leg via swimming pants, a hook and loop strap or as well as a stanchion supported by a knee hinge anchored below by the aforementioned leg stanchion. In this way, the leg stanchion could support both an ankle and knee hinge. Tension units could be linear springs or torsion springs.

Safety Concerns

Safety is the top priority in swimming, diving, snorkeling and other water activities and land activities. Those skilled in the art will recognize that many design alternatives have to be considered to help ensure safety, even though they may not be the most hydrodynamically powerful or most efficient solution. One hazard to avoid is having equipment shapes that might snag on underwater hazards and trap a diver. For example, the heel strap of a flipper might snag on a submerged branch. Heel straps are often seen as necessary and the risk is accepted. Similarly, leg straps, toe straps and foot straps should be maintained close to the body to minimize opportunity for snagging. When choosing exotendons, the use of elastic cord may create another opportunity for snagging and be acceptable for pool usage, but not for open water. The use of a dorsal fin shaped spring element creates a spring without openings which may pose snagging risks. This solid surface design is preferred over bungee cords because the dorsal fin shape is snag-resistant while the bungee cords might get hooked to a protruding sunken object.

SUMMARY

On land, the gait cycle, as well as activities that require lunging and jumping can be improved by integrating a means of plantar flexion assistance. The assist may be derived by tension springs, other types of springs, powered means or any combination thereof. When swimming, the swim propulsion finning cycle can be improved by integrating dorsiflexion assistance. The assist may be derived by tension springs, other types of springs, powered means or any combination thereof. These systems may share elements, such that they can be deployed to suit amphibious water and land usage.

Notes:

For clarity, this application assumes that elements such are generally symmetric around the medial and lateral sides of the foot and leg. For example, an ankle hinge is assumed to have similar deployment on medial and lateral sides of each leg, but is often referred to in the singular to avoid confusion.

For clarity, this application uses the word elastomeric to be inclusive of elastic elements as well elastomeric and stretchy materials. This application requires elastomerics that are highly elastic.

BRIEF DESCRIPTION OF THE DRAWINGS

FIGS. 1F and 1G are perspective views of the preferred embodiment in transition to land mode and in land mode, and FIG. 1H is a back view of the preferred embodiment in land mode. FIGS. 1I and 1J are a top view and a side perspective view of the blade and side-rails of the preferred embodiment.

FIG. 8B is a top view of the same preferred embodiment.

DETAILED DESCRIPTION OF THE DRAWINGS

Embodiment 1—Common Yoke/Integrated Sandal

Figure 1A:
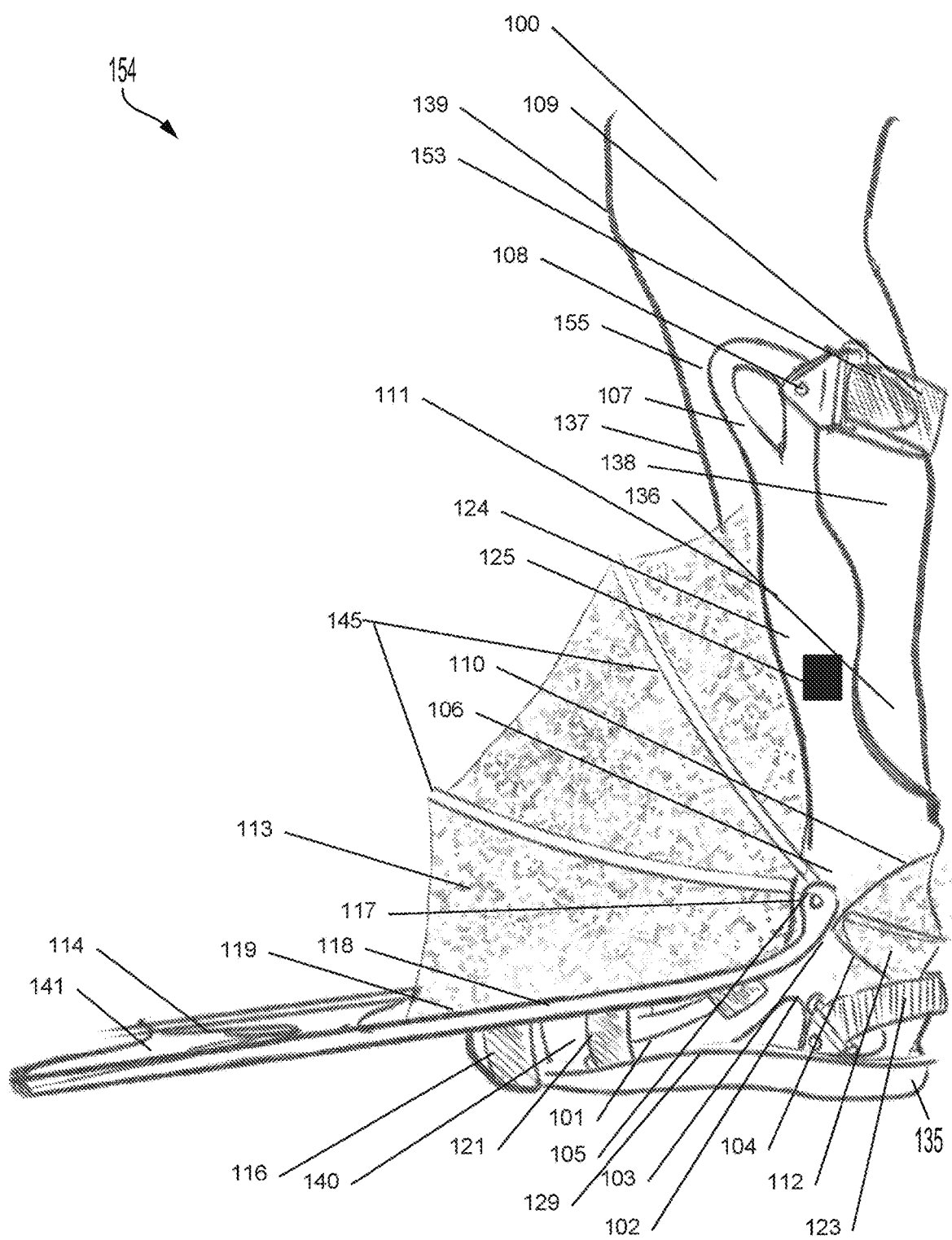
FIG. 1A is a side view of a preferred embodiment in swim mode
Figure 1B:
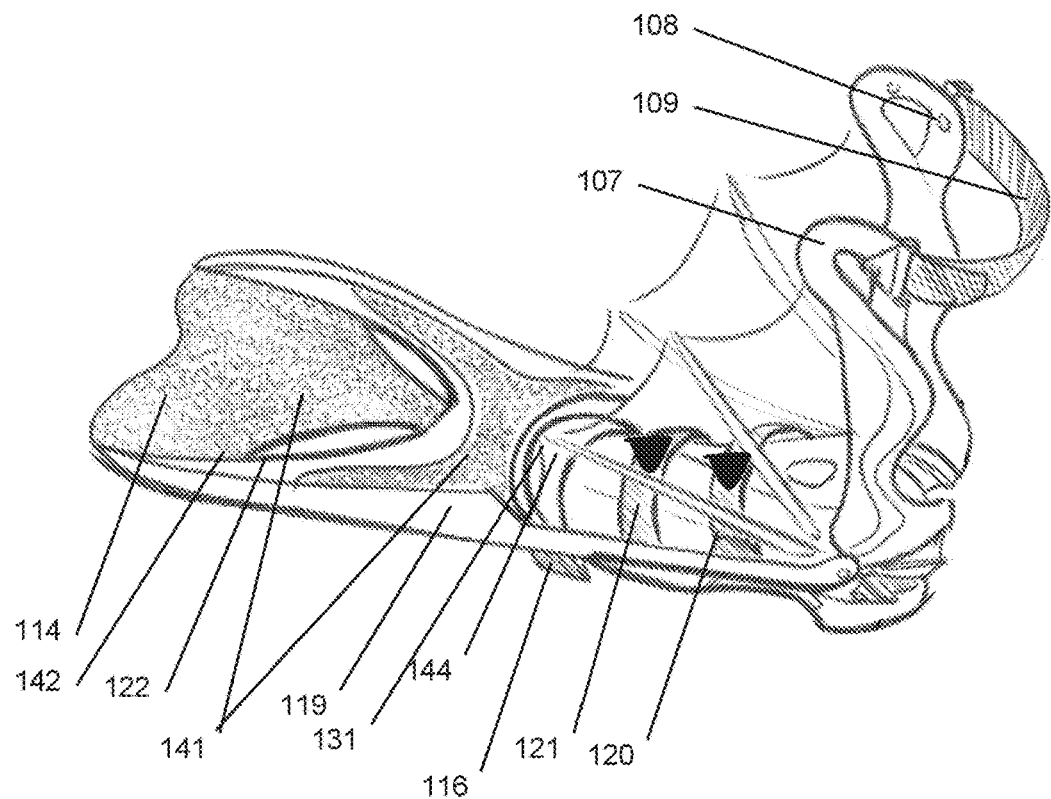
FIG. 1B is a top orthogonal view of the same preferred embodiment in swim mode.
Figure 1C:
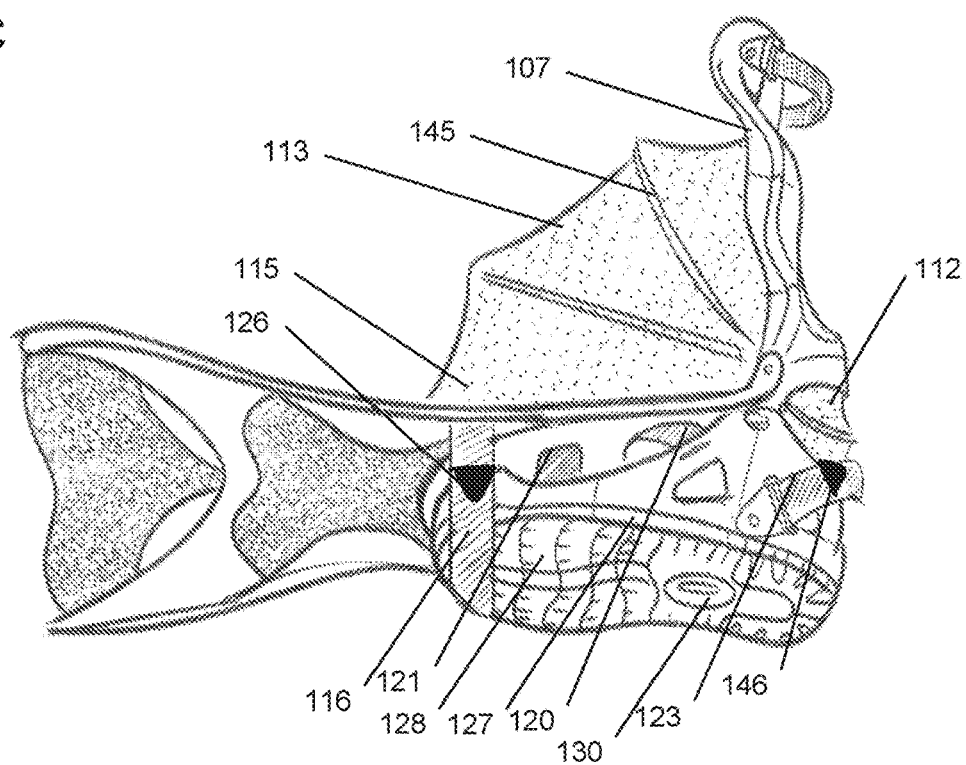
FIG. 1C is a bottom orthogonal view of the preferred embodiment in swim mode.
Figure 1D:
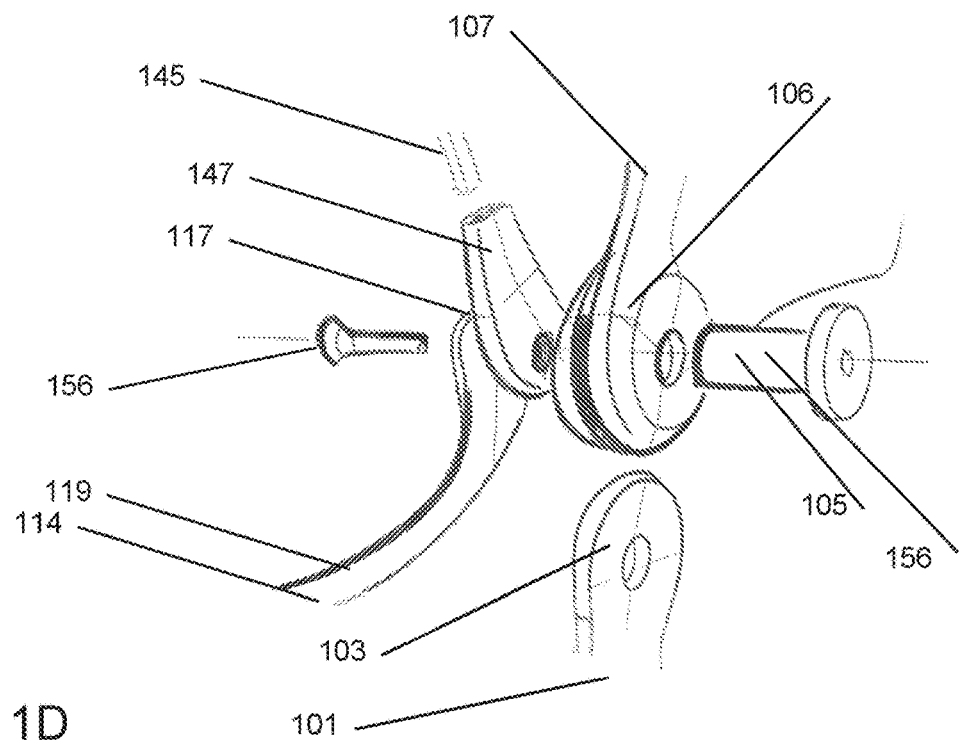
FIG. 1D is a close-up perspective of the hinge aspects of the preferred embodiment.
Figure 1E:
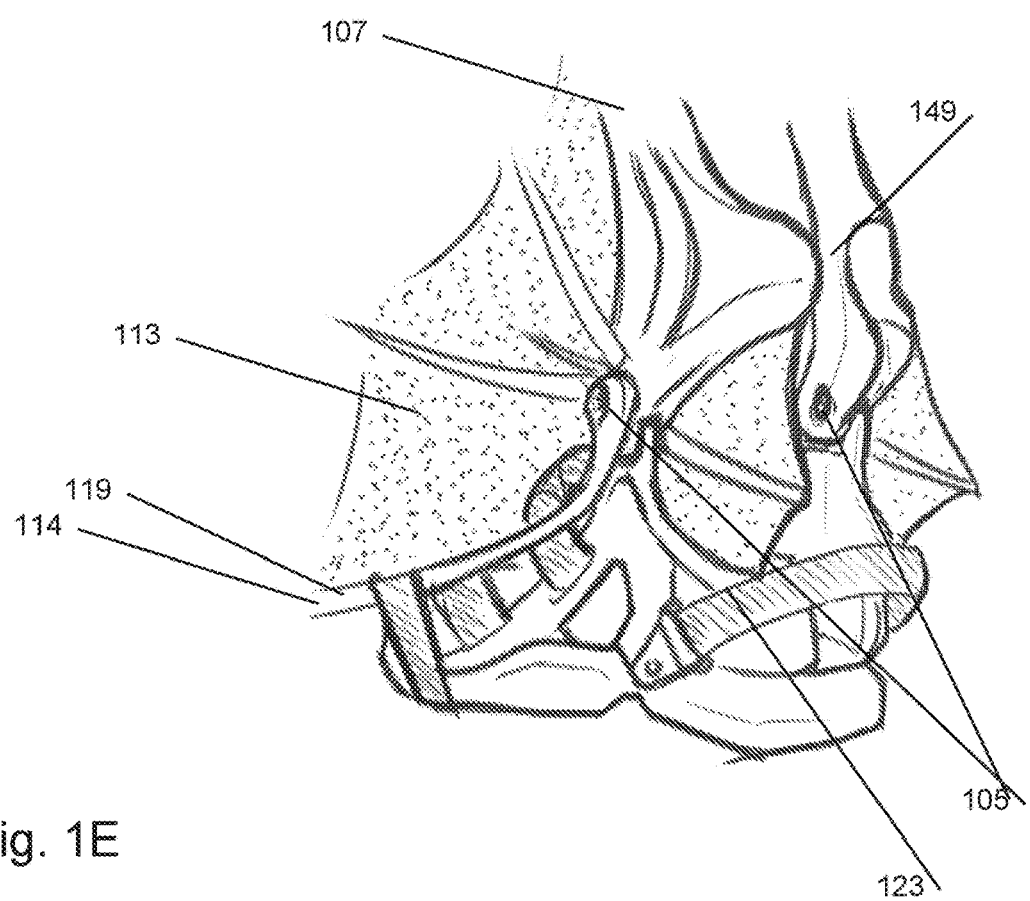
FIG. 1E is a rear perspective view.

FIG. 1A is a side view of a preferred embodiment in swim mode FIG. 1B is a top orthogonal view of the same preferred embodiment in swim mode, FIG. 1C is a bottom orthogonal view of the preferred embodiment in swim mode, FIG. 1D is a close-up perspective of the hinge aspects of the preferred embodiment, FIG. 1E is a rear perspective view, FIGS. 1F and 1G are perspective views of the preferred embodiment in transition to land mode and in land mode, and FIG. 1H is a back view of the preferred embodiment in land mode. FIGS. 1I and 1J are a top view and a side perspective view of the blade and side-rails of the preferred embodiment.

- 100 Lower limb
- 101 Base unit
- 102 Base unit sidewalls
- 103 Base unit hinge anchor zone
- 104 Base unit PF spring anchor zone
- 105 Hinge axle
- 106 Yoke hinge anchor zone
- 107 Yoke
- 108 Yoke leg strap anchor
- 109 Leg strap
- 110 Yoke PF spring anchor
- 111 Yoke DF spring anchor
- 112 PF spring element
- 113 DF spring element
- 114 Flipper
- 115 Flipper toe strap anchor zone
- 116 Flipper toe strap
- 117 Flipper hinge anchor zone
- 118 Flipper DF spring anchor zone
- 119 Flipper side rails
- 120 Base unit heel vertical securement means
- 121 Base unit forefoot securement means
- 122 Shin bridge
- 123 Base unit heel horizontal securement means
- 124 Yoke stanchions
- 125 Yoke anchors for flipper stowage
- 126 Flipper toe strap means of attachment detachment (hook and loop)
- 127 Base unit midsole
- 128 Base unit outsole
- 129 Base unit plantar contour means
- 130 Base unit bottom
- 131 Toe region
- 136 Lower leg
- 137 Shin
- 138 Calf muscles
- 139 Knee
- 140 Foot
- 141 Flipper blade
- 142 Flipper blade reinforcement
- 143 Footwear pass-through area
- 144 Toe protection area
- 145 Spring spoke
- 146 Base unit heel horizontal securement means closure
- 147 Spring spoke hinge anchor zone
- 149 Yoke rear open space
- 150 Side rail horizontal zone
- 151 Side rail twist zone
- 152 Side rail vertical zone
- 153 Yoke leg strap closure means
- 154 Amphibious exoskeleton system
- 155 Yoke edge radius
- 156 Barrel bolt In this preferred embodiment shown in FIGS. 1A through 1H, an amphibious exoskeleton system 154 is designed as a stand-alone article of minimalist amphibious footwear. This amphibious propulsive footwear exoskeleton system 154 can be configurable for both swim and land modes FIGS. 1A through 1C show the unit deployed in swim mode. Foot 140 of a user is inserted into a sandal styled semi-rigid base unit 101 disposed below the ankle. The foot 140 is secured in sandal style base unit 101 by multiple means, comprising a heel horizontal securement means 123 to restrain the foot from sliding backwards and out of the base, heel vertical securement means 120 to keep the heel from lifting up and away from the base (which can also be described as keeping the midfoot instep from lifting up and out of the base), sidewalls 102 to keep the foot from slipping sideways out of the base unit, forefoot securement means 121 to keep the forefoot from lifting up and out of the base unit and a toe restraint 144 to keep the foot from slipping forward out of the base.

In this preferred embodiment, base 101 is created from semi-rigid materials such as plastics, nylons, polyurethanes or any other known semi-rigid material. Base 101 may also be created through a combination of textile, flexible, semi-rigid, and rigid materials. The materials must be able to maintain performance in wet and mud environments. The performance of said material options may be further tailored by manufacturing approach, including injection molding, 3D printing, thermoforming, vacuum thermoforming, co-molding, knitting, and other approaches and combinations of approaches. Those familiar with the art of making shoes and boots are aware of the multitude of materials at-hand for the design of footwear, all of which are incorporated into this description.

The base unit heel horizontal securement means 123 provides sufficient support to maintain the foot in the base unit and prevent it from slipping backwards and out of the base unit. It comprises one of a semi-rigid heel counter, a rear wall that is constructed as a bridge between medial and lateral sidewalls 102, a heel cup, a heel strap, and other means of securement. Heel horizontal securement means 123 may include a wide variety of materials including plastics, nylons, various other semi-rigid, flexible, strap, elastomeric, lattice, hook and loop fastener materials and fabric means. Heel horizontal securement means 123 may also be oriented below the horizontal plane such that it establishes a means for vertical securement in addition to horizontal securement and help secure heel of the foot 135 to the aft portion of the base unit 101 and help prevent the heel from lifting up and out of the base unit 101.

In a preferred embodiment, the means for vertical heel securement 120 include a strap that anchors on the medial side of the aft region of the base unit 101, and traverses across the top surface of the instep area of the foot and is anchored to the lateral side of the aft region of the base unit 101. Said strap may also wrap around the lower leg above the ankle bones and have securement to the sidewalls 102 and or heel element 123. The means for horizontal heel securement to prevent the foot from escaping rearward include a heel strap 123, which can be adjusted by means of heel strap closure 148.

Base unit 101 comprises a midsole 127 as a bottom surface sufficient to prevent the foot from escaping downward. An outsole 128 provides a means for friction to the ground.

The front portion of the base unit 101 is secured to the forefoot by a base unit forefoot securement means 121. In a preferred embodiment, the means for securing the forefoot 121 portion of the base unit to the forefoot include a strap that anchors on the medial side and lateral sides of the forefoot region of the base unit 101 to prevent the foot from lifting up and out of the base, and a toe box 144 that can function well in retaining the forefoot from sliding forward. Toe box 144 and front foot securement means 121 can also be formed from a "T" shaped strap that anchors on the medial, front, and lateral edges of the base unit. Such a T strap configuration can perform its role without cinching on the forefoot or requiring constriction, and forms an effective soft toe box. Additional means for securing the forefoot also can comprise a traditional eyestay and shoe laces, D rings and hook and loop strap, among other options.

Said means of securement 120 and 121 may be independent of each other or may be merged into a single unit. Means of securement 120 and 121 may collectively provide a means for front closure. Means of securement 120 and 121 may be executed in many ways which include using the top surface of the foot box of a flipper, an eyestay and shoelaces, a set of D-ring openings and hook and loop straps, and many other approaches to establishing a top surface footwear closure. Yet another way is to design the sidewalls of base 101 such that they provide a traditional shoe front closure area that can include eyestays and shoelaces or hook and loop strap closures. In this way the sidewalls of base unit 101 would form the sidewalls of a shoe-like upper, or may work in tandem with an element that collectively form a shoe-like upper.

The heel region of base unit 101 comprises a plantar flexion spring anchor zone 104 at a distance away from the axis of ankle joint rotation. This allows PF spring element 112 to convey force and establish a joint torque between yoke 107 and base 101.

The base unit 101 is constructed with sidewalls 102. Such sidewalls are of sufficient rigidity to provide geometric stability to a hinge anchor zone 103, which provides anchoring for a hinge axis 105. Forces are delivered through the hinge axis 105 and into the hinge anchor zone 103. This includes both tensile, compressive and torsional force loads. As such, the sidewalls 102 transfer force and load between the anchor zone 103 and the bottom of the base unit 101 and must have sufficient strength to resist buckling, torsional deformation, stretching and breakage. Sidewalls 102 may have inherent buckle-resistant strength through the material modulus and thickness, or there may be rib shapes or other such geometric means of strengthening, or there may be employment of supplemental means of reinforcement, such as rigid stays or other materials or layers or lattice work. Sidewalls may be further strengthened by any combination of the above. Sidewalls may be constructed of materials that are part of multiple layers of footwear upper construction.

The sidewalls 102 and hinge anchor zone 103 establish ability for hinge axis 105 to be positioned and maintained in close alignment with the center of sagittal plane rotation of the ankle joint. In this way, the medial and lateral hinge axis 105 may be aligned with each other, and aligned with the axis of ankle rotation.

A semi-rigid yoke 107 is disposed above the ankle and below the knee, and comprises vertical side stanchions 124 on the medial and lateral sides. Said side stanchions comprise means for preventing buckling or deformation under compressive, tensile or torsional load, which may include ribs, reinforcing materials, stiffeners, among many other possible means. Yoke 107 further comprises a means for securement to the leg 109, positioned on stanchions 124 at a distance from the hinge 105, to create a torque. Said yoke forefoot securement means 109 is disposed to the front of the leg in land mode and to the back of the leg in swim mode. Said yoke securement means may be accomplished by a strap that traverses from medial to lateral sides and rotated upon its anchors to switch between being disposed to the front of the leg for land mode and rear of the leg for swim mode. Said means for securement 109 to the front of the leg in land mode and securement to the back of the leg in swim mode comprising at least one leg strap sufficient to conduct force when oriented to the front surface of the leg in land mode, and to conduct force when oriented to the back surface of the leg in swim mode. Said at least one leg strap 109 is anchored to the stanchion at a distance from the ankle joint to establish a torque.

Said yoke 107 is rotatably connected to the base by means of hinge axis 105 through yoke hinge anchor zones 106. This allows a full range of motion of the foot in dorsiflexion and plantar flexion.

Said yoke 107 comprises at least one yoke plantar flexion spring anchor zone 110. Said PF anchor zone 110 typically disposes behind the ankle near the base of the yoke, at sufficient distance from hinge 105 to establish a joint torque. PF spring element anchors to PF spring anchor zone 110 allowing force transfer between the two. Said yoke 107 also comprises at least one yoke dorsiflexion spring anchor zone 111 disposed near the top of the stanchion along its forward edge, the elevation of which helps to establish a joint torque.

A flipper assembly 114 is rotatably mounted to the hinge axis 105. It has sufficient rotational range of motion to be disposed along one of the base 101 in swim mode and the yoke 107 in land mode. When disposed along the base 101, flipper 114 must have sufficient range of motion to allow the foot to rotate in the sagittal plane through the foot's full range of motion. A full range of motion for a user might require 25 degrees or more of ankle/foot dorsiflexion and 70 degrees or more of plantar flexion in the sagittal plane. Said flipper 114 is rotatably attached on the medial and lateral sides to the hinge axis 105 through flipper hinge anchor zone 117 which are connected to flipper side rails 119 on medial and lateral sides of flipper 114. Flipper side rails provide sufficient rigidity to establish connection from the hinge anchor 117 to the forward aspects of the flipper assembly 114. Forward aspects of flipper assembly 114 comprise a hydrodynamic blade 141 and flipper blade reinforcement 142 both of which are secured to the side rails. Hydrodynamic blade 141 being capable of creating propulsive force on the water. Said flipper assembly 114 comprises means for force transfer 116 to at least one of the bottom of the forefoot or the bottom of the base unit in proximity to the forefoot during swim mode. Said flipper assembly 114 also comprising means for securement to at least one dorsiflexion torque assisting spring elements 113 at a flipper assembly PF spring anchor zone 118. Said flipper assembly 114 comprising means for distal securement of a propulsive blade 141 and blade reinforcement area 142.

Base 101, yoke 107, and flipper 114 can rotate independent of each other while preferably sharing a common axis of rotation 105 which is aligned with the ankle joint axis of rotation in the sagittal plane. The system may also employ two axes of independent rotation; an axis for the yoke 107 and base 101 for PF assist, and an axis for the yoke 107 and flipper 114 for DF assist, both of which are placed in close proximity to the ankle joint axis of rotation. In the event of having two separate axes of rotation, the PF assist would preferably be most closely aligned with the ankle joint axis of rotation, and the DF assist would be placed forward and/or above the PF assist hinge to reduce likelihood of interference.

The at least one hinge system may be deployed as a hinge axis 105 which may be comprised of any number of means of allowing rotation between the base 101 and yoke 107, and between the base 101 and flipper 114, as well as provide a means for rotation of spring spokes 145. Such means include a stub axle on one element and the other elements having holes through with the stub axel passes through, stub axle on one element nested within a hollow stub axle on another element nested inside a hole on the other element, elastomeric bending live hinges, ball and socket joints, two stub axles straddling a common hole, barrel nuts, among others. The units may also be connected by an elastomeric bar hinge that enables rotation, live hinges, or any combination of hinge types known to those skilled in the art. A hinge may be designed that biomimics a cross-section of the ankle mortice that allows motion in the sagittal plane, allowing a hinge joint that can also slide. Hinge axis 105 must have means for sufficient strength to accommodate forces during both land and swim use.

One preferred approach to hinge axis 105 is in FIG. 1D. In this Figure, yoke 107 is seen as it shares a common stub axle 105 with base unit 101, flipper 114 and spoke 145. Stub axle 105 comprises a barrel nut and bolt 156, but may be in any number of axel shafts or stub axel shaft types. In this embodiment, yoke 107 is connected to the hinge 105 through yoke hinge anchor zone 106, which is configured as a fork member that passes over and around the surfaces of the base unit hinge zone 103. Barrel nut 156 provides enough shaft length to also allow the flipper hinge zone 117 and spring spoke hinge zone 147 to rotate on a common axis that is close proximity of the axis of rotation of the ankle joint in the sagittal plane.

At least one spring element provides means for plantar flexion assisting torque between the yoke and base, and dorsiflexion assisting torque between the yoke and flipper. In this preferred embodiment, two spring elements are shown as PF spring element 112 and DF spring element 113. These two spring elements may be discrete or contiguous elements, because they are anchored as needed to provide these torques in the region where it is needed.

Swim Mode

In swim mode, during the up stroke of bipedal or unipedal flutter kick, the user naturally planter flexes. Force from the plantar flexing foot is directed into flipper toe strap 116. There is a mechanical connection between flipper toe strap 116, flipper toe strap anchor zone 115, and flipper 114. When swimming, during the up stroke, the user exerts PF force into toe strap 116 to induce force into the flipper to exert propulsive force on the water to create a swimming velocity. In the preferred embodiment, the user exerts an additional amount of PF force beyond the force of water propulsion to stretch a DF assist spring 113. Directing force into the DF assist spring 113 also results in forces directed to flipper anchor hinge zone 117 and hinge axis 105. This creates stored potential energy in the spring 113. Said elastic potential energy creates DF assist joint torque between the yoke 107 and flipper 114 with a moment arm around the hinge 105 aligned with the ankle joint in the sagittal plane. During the down stroke, the potential energy is released, increasing the dorsiflexion joint torque and accelerating the motion of the blade through the water, thereby augmenting propulsion, while reducing effort.

Forces exerted to and from the yoke from the DF assist spring 113 and hinge 105 are grounded to the back of the leg 100 through the yoke leg strap anchor zone 106 and leg strap 109. In swim mode, leg strap 109 is oriented so that it is positioned around the back of the leg. In land mode, it may be rotated to be positioned around the front of the leg. Leg strap 109 may also be circumferential, as long as forces from front leg and back leg are effectively transmitted into the yoke. Forces in the yoke are transferred through the yoke hinge anchor zone 106 and into the hinge axis 105 and the yoke DF spring anchor zone 111 and the DF spring element 113.

In a preferred embodiment, DF spring element 113 is comprised of a thin sheet of elastomeric material and disposed on the medial and lateral side of each foot. In other embodiments this can be configured with only one spring element per leg. In the preferred embodiment, DF spring elements 113 are disposed on both medial and lateral sides and collectively develop 56 foot-pounds (+ or −54 foot-pounds) of torque at maximum PF range of motion between the yoke and flipper, and resembles the dorsal fin of a fish, suspended between the front of the yoke 107 and the flipper 114.

The use of the a dorsal fin design assists in several ways; it reduces the opportunity for holes or cords to create unwanted snagging areas, it helps establish a radial force vector that is tangential to the arc of the radius at any given point—thereby maximizing the torque between the flipper side rails and the yoke vertical rails, it has a good aquatic aesthetic appearance commonly seen in fish, it allows for different materials to be placed across the surface area, and allows proper anchoring of the spoke stay semi-rigid elements and hold them in rotatable configuration around the axis of rotation.

DF spring element 113 may be comprised of different spring rates in different locations of its surface area. For example, the drawing, there are three principle spring elements disposed between the flipper rail, two reinforcing spring spokes, and vertical yoke rail. Each of these three triangular shaped segments may be comprised of different spring rates. These spring elements may also be made to have different spring properties at different rates of extension, for example, a fabric laminated sheet of latex would have the spring rate of the latex for a given length of stretch, but would arrive at a much higher spring rate when the fabric reached its maximum stretch length. In one embodiment, such a three spring rates of dual layer springs could be deployed in each of the three triangular segments. The segment proximal to the leg would comprise a weak spring with a large range of motion that would easily gather into a small volume when not in use—thereby helping to keep the springs tidy when stowed. The segment closest to the flipper would have the most stiff spring—and would only stretch when the other two springs had reached their limits. In this way—the spring element proximal to the flipper can stretch rather orthogonally to the flipper side rail and maximize the torque forces because they are close to perpendicular to the rail. The segments can be deployed as adjustable, or swappable to accommodate the preference or mission of the diver.

As the user completes the up stroke and transitions to the down stroke, the ankle angle reaches maximum PF range of motion between the flipper and yoke, establishing maximum spring elastic potential energy. Said energy is then returned as DF assist joint torque during the down stroke. For example, assume a user traditionally applies a maximum of 35 foot pounds of PF joint torque into the flipper during upstroke and 14 pounds of DF joint torque into flipper during the downstroke. Engaging the proposed device with a maximum PF spring force of 54 foot-pounds during the upstroke would require the user to exert said 54 foot pounds to load the spring and their normal 35 foot pounds for a total of 89 foot-pounds of PF torque exertion. This amount is less than the exertion of walking. Said spring force of 54 foot-pounds can then be delivered from the spring to replace or augment the DF joint torque, allowing the user to relax and not do any exertion and still have more propulsive torque during the important downstroke and transition to upstroke. Or the user may augment their typical 14 pound force to a total of 68 foot-pounds of joint torque.

The DF spring element may benefit from stays disposed radially like spokes of a bicycle wheel to help maintain structural stability, reduce billowing while slack, and create an arrangement that helps maintain distance of the spring element away from the center of rotation, thereby increasing the torque leverage of the spring element. The use of a dorsal fin configured elastomeric shin and stays improves the aquatic aesthetics, reduces frontal surface area friction, reduces void areas susceptible to snagging submerged hazards, and enables tidy storage with minimum billowing of the sheet when not in use.

As mentioned, DF spring element 113 may be configured out of a wide variety of materials and combinations of materials. DF spring element 113 may be configured as a tensile spring or a combination of various springs in series or parallel. DF spring element 113 may be configured as a lattice of 3D printed elastomers using generative design to change and optimize the spring stiffness across the range of motion.

Flipper toe strap 116 is configured with a means of connection and disconnection 126 to enable ease of deployment and release in the way it detachably connects to the foot. Those skilled in the art can envision the use of hook and loop straps, buckles, and other means to accomplish this ease of deployment and release from deployment.

Flipper toe strap 116 may be configured to contact the bottom and top of the forefoot or alternatively it may be configured as a hammock-style strap with force transfer connection to the bottom of the foot only. When flipper toe strap 116 contacts the bottom and top of the forefoot, it maintains the forefoot's ability to apply both DF and PF swim propulsion forces. Men the flipper toe strap 116 contacts only the bottom of the forefoot, it only allows the user to apply force in the plantar flexion direction, and relies upon the DF spring element to apply force in the DF direction without requiring power input from the user. As stated earlier, a user may impart additional PF force during the upstroke to store elastic potential energy, which can then be returned during the downstroke to either augment a user's DF motion or to replace a user's DF exertion, thereby increasing propulsion, reducing DF muscular demand or both. Having the flipper toe strap 116 be of adjustable length allows for fine-tuning by the user to adjust the PF angle at which the spring begins to engage, and the cruise angle of the blade during swimming. These factors may be adjusted by designers in the design process, and may also be adjusted prior to donning the units by trading different length springs and different sized toe straps. Spring stiffness rate may be selectable based upon swimmer's body mass, foot size, desired activity level, and other factors.

During this cycle of dorsiflexion assist, there are downward forces exerted through the yoke 107 and into the hinge axis 105. The hinge axis 105 is maintained proximal to the ankle joint axis by the base unit 101. Said downward forces imparted into the base unit during DF assist are primarily downward and rearward forces, causing the base unit 101 to tend towards slipping down and back. The base unit vertical heel securement means 120 maintains the base unit in contact with the foot, and overcomes the downward force in the base unit. Heel securement means 120 can also constrain forward forces during PF assist which might otherwise cause the base unit to slide forward and possibly off the foot. Base unit 101 is further maintained close to the foot by base unit forefoot securement means 121 and base unit heel horizontal securement means 123 which may also provide vertical securement. These means of securement may be comprised of straps or any number of other means familiar to those in the footwear and flipper making industries.

In swim mode during aggressive plantar flexion motion of the flipper assembly. There is a torque established in the base relative to the heel. The sidewalls of the base must be sufficiently strong to provide means for anchoring the hinge area to prevent the torque from lifting it up. Thus the presence of the heel of the foot helps establish an anchor to provide that stability.

Amphibious Transitions

Upon completion of swimming, and a desire to transition to land mode, leg strap 109 is switched from the back of the leg to the front of the leg. The user detaches the flipper toe strap 116 from connection with the forefoot. Flipper toe strap 116 includes means of connection and disconnection 126 that are familiar to those skilled in the art—such as hook and loop closures, buckles, cam locks, etc. Such means of connection and disconnection 126 are preferably configured such that the same means may also enable securement of the flipper during land-use stowage, against the shin.

Said detachment of flipper toe strap 116 from the foot enables flipper 114 to rotate upward. Flipper 114 may be stowed by resting against the shin of the leg 100. More specifically, flipper 114 may be detachably attached to the yoke 107 by detachably attaching the flipper toe straps 116 to yoke anchors for flipper storage 125 by means of connection and disconnection 126. For example—if toe strap 116 includes a medial hook and lateral loop element—they may connect to each other to create a hammock toe strap, and may also be separated from each other and then attached to reciprocal hook and loop touch-down points on the yoke. The flipper toe straps could also encircle the back of the leg as another means of securement during stowage. Yet another means of stowage is to connect the flipper to the heel of the base unit 101 through a supplemental PF spring element to augment PF spring force.

When the user is done with land use and wants to enter the water, they can detach the flipper from stowage, allow it to rotate downward, and then secure the flipper toe straps 116 under or around the forefoot area of the base 101.

Land Mode

FIG. 1F shows the preferred embodiment in amphibious transition, and FIGS. 1G and 1H show the preferred embodiment in Land Mode. When the flipper is stowed against the shin, it acts as a shin guard for the user to protect against contusions and lacerations of the lower limb. In a preferred embodiment, the flipper is passive during land mode and does not translate significant power or force during land mode.

When in land mode, the PF spring element is active and contributing. During the gait cycle, as the user is in stance phase, the ankle joint dorsiflexes. As it dorsiflexes, the Achilles tendon is stretched. Yoke 107 rotates relative to base 101. Dorsiflexion results in force being transferred from the front of the leg and into leg strap 109, said leg strap 109 being positioned on the front of the leg during land mode. Force from leg strap 109 is transferred into yoke leg strap anchor zone 108, which is mechanically connected to yoke 107. Yoke 107 transfers this force through yoke hinge anchor zone 106 and into the hinge axis 105, and through yoke PF spring anchor zone 110 and into PF spring element 112. As the user dorsiflexes, PF spring element 112 is stretched or otherwise acted upon which results in the storage of elastic potential energy.

PF spring element 112 is attached between yoke 107 and base 101. In a preferred embodiment, this is established by an elastomeric sheet that is suspended behind the ankle that attaches to the aft lower portion of the yoke 107, and the heel wall area of the base 101.

The release of elastic potential energy in PF spring element 112 establishes a plantar flexion torque between the base unit 101 and yoke 107. Said force passes through the base unit hinge anchor zone 103 and based unit PF spring anchor zone 104. The torque in base unit 101 is delivered into the ground 150. The torque delivered is proportional to the distance of the spring from the axis of rotation. Clinical study data shows that when the user is in motion, the majority or all of the torque is delivered into the ground 150. When standing still, a portion of the torque in the base unit lifts the heel of the user.

In this way, PF assisting torque in the base unit can improve gait and lunge propulsion of the user, while also reducing the plantar pressure experienced by the bottom of the foot.

Spring Element Placement

There is at least one spring element. Said at least one spring element may be divided into a PF assisting portion to establish the PF spring element 112 and a DF assisting portion to establish the DF spring element 113. The PF spring element and DF spring element may be separate and discrete elements. In the most simple of embodiments, the PF and DF spring elements are discrete. The PF spring element is disposed between yoke 107 and heel region of the base 101, and the DF spring element is disposed between yoke 107 and flipper 114.

Yet, especially because flippers and water shoes are made of stretchy materials, the aggregate spring displacement may be distributed across a broad range of elements. For example the flipper DF spring anchor zone 118 may be constructed of an injected molded elastomer which has the ability to stretch. Similarly, the flipper toe strap anchor zone 115 may be also constructed of an elastomeric material which has the ability to stretch. As such, the elastic modulus of the flipper DF spring anchor zone 118, together with toe strap anchor zone 115 may change the stiffness and deformation requirements of the DF spring element 113. This is further compounded by the deformation of any material between the flipper toe strap anchor zone 115 and the flipper side rails 118. Thus, designers will have to consider the entire system modulus when selecting spring rates.

Similarly, designers may choose the location of where the flipper DF spring anchor zone is placed relative to the hinge axis 105, flipper toe strap anchor zone 115, and the distal tip of the flipper 114. In a preferred embodiment, the sheet elastomer spring would anchor along the flipper side rails 119 in the zone of the metatarsal heads of the foot and the toe strap 116. There may be a curve along the flipper side rails 118 to compound the spring effect. Designers may choose to establish a curvature to the side rails 118 in the neutral position that becomes a more straight shape when under the highest DF spring load. This can augment the range of spring motion and spring energy storage. Placement of the spring further away from the hinge axis 105 improves leverage of the spring.

Flipper

Perspective views of the flipper are found in FIGS. 1B and 1C, a top view of the flipper may be seen in FIG. 1I and a side view in FIG. 1J. The flipper 114 comprises side rails 119 and flipper hinge anchor zone 117 which establish a rotatable connection through hinge axis 105 to the yoke 107. Flipper side rails 119 provide structural support for at least one blade 141. Blade surface 141 and blade reinforcement 142 in traditional flippers are historically both comprised of rubber, and may be considered integral in construction. Flipper 114 may also comprise multiple blade 141 regions and multiple blade reinforcement 142 regions leading to a variety of possible combinations of elastomeric material together with semi-rigid materials for structural integrity and provision of desired bending modulus. Blade 141 and reinforcement 142 may be selected of materials of sufficient flexibility to allow them to partially bend when stored against the shin, to reduce likelihood of interference with land activities. Flipper blade 141 may be optimized for military use by using light weight flexible materials, including aramid fabrics such as Kevlar brand fabric, nylon woven fabric, Spandex brand stretch fabric or a wide array of other materials. The blade surface may also be rigid—and in the shape of a hydrofoil blade, similar to the concept of airfoils for race car wings. Said hydrofoil shaped blades may be convex in shape to allow improved conformance to the shin and leg while in storage. One skilled in the art can design the geometry of the siderails 119, blade 141, blade reinforcement 142 and other elements to optimize for desired flex and hydrodynamic properties. In the preferred embodiment, the blade 141 and blade reinforcement 142 have a collective surface area that is 6" wide by 8" long but this application incorporates blades of different size widths and lengths. A footwear pass through area 143 is established between the siderails and in the blade area to facilitate attachment of the flipper toe strap 116 with minimal loss of blade surface area. Because of the augmented DF power, the whole system will flex more, thereby requiring stiffer materials.

Spring Type Options.

PF spring element 112 and DF spring element 113 may be executed in a variety of ways. In several embodiments, spring elements 112 and 113 are linear tension springs that are positioned between the semi-rigid yoke and base as well as between the semi-rigid yoke and flipper. Said spring connection located at a distance away from an axis of rotation enables a joint torque to be developed. The at least one spring element comprises a plantar flexion assisting portion that connects at the yoke above the ankle and at the base unit behind the ankle joint, as well as a dorsiflexion assisting portion that connects the yoke above the ankle and flipper in front of the ankle joint, thereby creating a torque.

The tension springs are anchored on the semi-rigid elements at a distance from the hinge point, thereby providing an ability to develop torque in a two bar hinged system. Said linear tension element designs may include sheets of elastomeric material, bungee cords, coil tension springs, 3D printed lattice material, stretch knit fabric, rubber bands, and a wide variety of tensile materials that stretch in a generally tensile manner. These tension springs can be used individually and discretely or in serial or parallel combination with other springs. They can be used in serial or parallel combination with a powered actuator.

Spring elements 112 and 113 may comprise a portion of generally flat material that resists being caught by protruding objects, said generally flat materials being elastic or being disposed with other materials that collectively provide a means for providing spring tension and a means for providing resistance to being hooked by underwater protruding objects. Said flat material may be a stretch fabric such as a tricot, that provides a flat protective cover for bungee cords disposed behind it, providing the stretch of bungee with the flat surface of a fabric.

FIGS. 1A, 1B, 1C, 1E show an example DF spring element 113 designed in a dorsal fin arrangement. For a dorsal fin arrangement, there is at least one sheet of flat material between the flipper and the yoke. In the preferred embodiment, there are both medial and lateral dorsal fin springs, each spring having at least one semi-rigid spoke element disposed within. The said semi-rigid spoke element biomimics the anatomy of a fish's dorsal fin and helps to maximize torque while stretched and, as shown in FIGS. 1F and 1G, helps to minimize billowing while slack. Spring element 113 or element 112 may be divided into smaller sections on either side of the at least one spring spoke, enabling a combination of different spring rates, or a combination of a tensile spring material with a non-stretchy material such as a woven rip-stop fiber, enabling the tuning of the spring response to meet the needs of the user's morphology and activity goals.

Springs may also be a torsional. Torsional springs deform in a bending motion and are located in alignment with the ankle joint axis of rotation. Such torsional springs include coiled spring with a center of the coil being co-axial with the ankle joint's axis of rotation, bar hinges, live hinges, sidewalls that deform in the sagittal plane, and others. The torsion springs can have their two ends anchored to the hinged semi-rigid elements. For example the DF spring elements would be anchored to the flipper and yoke, and PF spring elements would be anchored to the base and yoke.

Spring types may be mixed to allow parallel springs in which both torsional and linear springs are engaged. Such parallel springs may have separate spring rates and may include different anchor locations. In this way, different springs may start to engage at different goniometric angles, providing non-linear spring response as desired for a given application.

Spring Construction and Integration Options

Said springs may be constructed from materials that are different and discrete from semi-rigid materials and mechanically fastened to semi-rigid elements. For example, securing a bungee cord to a nylon semi-rigid member by use of an anchor hole with a tied knot.

Spring elements may also be integral in construction with the one or more of the base, flipper and stanchion yoke. Flippers being sold commercially are frequently constructed with integral elastomeric cast materials together with semi-rigid elements, for example by overmolding or co-molding. Multiple elements may be integrally constructed, including the blade, side rails, foot holder, straps, springs, spring anchors, yoke, base, flipper, and others. Said springs may be integral in construction with two or more of the elements—for example the base and yoke stanchion PF spring or the flipper and yoke DF spring or other combinations. This can be accomplished via traditional overmolding, comolding, laminating, adhesive bonding, additive manufacturing, or other means of integral manufacture. This approach can also be executed as part of multi-material 3D printing.

Such springs may be fastened to the yoke or flipper or any combination of integral design on one element and fastening on another element.

Springs may be used in any combination. For example, springs may be used in serial or parallel with other springs and spring types. Springs may be used in series or parallel with a powered actuator. The PF and DF assist can be driven by a powered actuator without the need of springs.

Spring elements may incorporate a tension adjusting mechanism to adjust the DF or PF angle at which the spring element first engages, which thereby also impacts spring displacement and spring force during DF and PF range of motion. Leg strap 109 allows for adjustment of its length, which confers an adjustability of the initial angle at which each of the PF and DF assisting springs engage, thereby changing their stiffness characteristics.

An adjustable tension mechanism may be inserted serially between the spring element and the anchor zone of the yoke, flipper or base. In this manner, the intervening adjustment means can extend or contract the amount of distance between one edge of a spring element and the anchor zone to which it is connected. One means is the use of a cable or multiple cables and an adjusting ratchet to control the length of the cable(s). Such a system would allow the means for adjustment to be anchored to the anchor zone of the flipper, yoke or base, and also connected to one edge of the PF or DF spring element. A ratchet and cable would provide means for adjusting the length of the adjustment cable.

Yet another approach would be to make the anchor zone of the yoke, flipper or base be controllable, while leaving the spring element of consistent length. Such elements are common in sailboat sail trimming designs, such as the boom vang, which controls the position of the cantilever boom relative to the deck of the boat; tightening the boom vang creates a greater distance between the boom and mast, thereby tightening the tension in the sail as measured in cord length parallel to the hypotenuse of a triangular sail shape. Yoke PF spring anchor zone 110 can help provide means for adjustment relative to base unit PF spring anchor zone 104 by several means, including adjusting the tightness of yoke leg strap 109 around the front of the leg. In other embodiments, not depicted by drawings, yoke PF spring element anchor zone 110 may be able to rotate as a cantilever relative to the vertical portion of yoke 107, and in such configuration, tensile support mechanisms disposed between the vertical aspects of yoke 107 and cantilever aspects of yoke 107 would hold the position of the cantilevered PF spring anchor zone 110 and could be made adjustable by a variety of means.

Lattice Spring Options

Linear tension springs, such as bungee cords or sheet elastomers, typically abide by Hooke's law and deliver a force that is a function of the displacement of the spring multiplied by a spring rate. That spring rate can increase when a spring approaches its normal working range length. For example, a rubber band increases its spring rate when you pull it toward its yield point. One objective of one embodiment is to provide an optimal spring rate over a wide range of motion. Elastomeric lattice structures allow stretching to occur in both the lengthening of the discrete lattice member elements, as well as the rotation and angular deformation of the lattice intersections. In this way, the spring rate can be maintained over a longer range of motion than might be possible with a sheet or cord elastomeric. Lattice structures also allow for reduced weight and an ability to allow air and water flow. Lattice structures also allow for different rebound speeds, thereby allowing for different speed of energy return as compared to a bungee cord of similar average spring rate. Lattice elements may be exposed with open sidewalls, or they may be covered by a thin laminar skin if the environment requires.

Modular Attachment and Detachment Options

In certain use cases, it may be helpful for the flipper 114 and DF spring elements 113 to be attachable and detachable from the rest of the system. For example, in military activities where the user arrives via swimming with no planned return to the water. In this case, the DF spring element 113 may be required to be detachable from the yoke 107, the flipper 114 may be also be required to be detachable from the hinge 105, and the flipper toe strap 116 easily detachable from the base unit 101. In this manner, upon arrival to a field of duty, the flipper and DF spring could be removed and disposed of as desired.

Similarly, a military activity may extend for a lengthy time and not require a flipper or shin guard for extended time, in which the flipper 114 and DF spring element 113 may be more easily stored in a backpack. In this scenario, a rapid attachment of the flipper 114 to the base 101 by connecting the flipper anchor zone 117 to the hinge axis 105, a rapid attachment of DF spring element 113 to yoke 107 by connecting to yoke DF spring anchor 111, and rapid attachment of flipper toe strap 116 to the base unit 101.

Such rapid attachment and detachment means may be by a wide variety of means. Attachment and or detachment of DF spring element 113 by the yoke DF spring anchor 111 may including hook and loop straps, hooks, rings, buckles, buttons, zippers, adhesives, cut-able strap elements, latches, key slots, knots, zip tie, fasteners, shoe laces, knotting, C shaped channels along the leading edge of yoke 107, and any other method known to those familiar with the art. Attachment and or detachment of the flipper 114 through the flipper anchor one 117 to the hinge axis 105 may be by a wide variety of means, comprising use of a barrel bolt that can be removed and reinserted to include whichever rotating elements are desired, use of a clip or cotter pin on the end of an axle to allow for rapid installation and removal, and a variety of other means such as a soft hinge pin in lieu of a barrel bolt such a an aramid fiber cord, a sleeve or pocket type female receptacle to accept the flipper side rails 119 to the hinge axis 105, and any other means familiar to those skilled in the art.

Flippers that do not need to be stowed along the shin, but are preferably detached and stored elsewhere may benefit from not needing to attach to the hinge axis 105. They may simply attach to the base unit, and rely upon the hinge between the base unit and yoke. For example, the base unit or base unit footwear may have a small channel along the medial and lateral outsole between the metatarsal heads and the heel. In this manner, side-rails 119 of a given outer diameter may be inserted into said channels of larger inner diameter and once fully inserted, can be locked into place.

Range of Motion Parameters.

In a simplistic embodiment, there would be a neutral zone or overlap zone between PF assist and DF assist. A neutral zone would represent a range of motion in which there was no PF or DF assist. An overlap zone would represent a range of motion in which both PF and DF assist were both active. In a preferred embodiment for walking optimization, a neutral zone would be established between approximately 10 and 15 degrees of plantar flexion, and for running optimization a neutral zone would be established between approximately 14 and 19 degrees of plantar flexion.

For example, if PF spring element 112 were designed to engage at 10 degrees plantar flexion, then it would be slack during swimming when the user is plantar flexed 20 to 80 degrees. And, when swimmers attempted to bring their foot to the neutral position, they would meet spring resistance starting at 10 degrees PF, which would require some intentional effort to bring their foot to the neutral position. This is not a common ankle angle during flutter kick, and is not anticipated to be a performance or safety issue.

The DF spring element 113 is designed to assist in swimming. During swimming, healthy users can extend their ankle to 80 degrees or more of plantar flexion. Thus, if the DF assist spring element started to engage at 10 degrees plantar flexion, there would be 70 degrees of DF spring assist range of motion.

In a preferred embodiment, the user can adjust the leg strap 109 to alter the position of where the neutral range of motion between PF and DF assist. For example, in land mode, when the leg strap is positioned on the shin and tightened, it may start PF engagement at 15 degrees of plantar flexion, and when the leg strap is loosened, it may start the PF spring engagement at 2 degrees of plantar flexion.

Similarly, in swim mode when leg strap 109 is positioned behind the leg, it can also be tightened or loosened to establish the angle where the DF springs start to engage.

In a preferred embodiment, the user can adjust the leg strap bias towards aft or forward. For example, by having separate sets of hook and loop closures for front and rear of the leg strap, or by having separate leg (shin) strap for front of the leg and separate leg (calf) strap for the back of the leg. In this manner, one can bias where one wishes the center of the neutral point to be.

Shin Bridge

In the preferred embodiment, the flipper blade reinforcement 142 may also act as a shin bridge 122. The shin bridge 122 is a semi-rigid or rigid element that is positioned near co-axial to the leg strap 109. The purpose of shin bridge 122 is to establish a mechanical means of reducing, squeezing forces between the medial and lateral yoke 107 stanchions imparted when the leg strap 109 is under tension. Without such a bridge, when the leg strap 109 is placed in tension by the front or back of the leg, the medial and lateral yoke 107 stanchions would be drawn closer together thereby squeezing the medial and lateral aspects of the calf muscles of the leg. This establishes a risk for chaffing and skin irritation. Thus, the shin bridge 122 provides a means for leg strap 109 to pass through or pass over a mechanical object of similar width to the leg, such that even under tension, there is no mechanical force vectors that would squeeze more than the width of the separation provided by the bridge. Said bridge 122 would be padded to improve comfort while pressed against the skin.

Springs and spring spokes are shown on medial and lateral sides of each foot—but a similar design objective may be accomplished with a single spring and yoke stanchion along the midline of the foot and leg as a means to reduce cost and improve water flow. In such a configuration, said single stanchion would require a fork near the base to help establish a pathway to ground. Lower performance variations could allow the stanchion to be vertically supported by the foot, but this is not ideal and it is limited in how much force can be transmitted.

When swimming, user plantar flexes and stretches dorsiflexion assisting spring elements during the up stroke. During the down stroke, elastic potential energy in said spring elements 113 is released and augments and accelerates dorsiflexion torque, increasing swim propulsion.

2 Alternative Spring Version

Figure 2A:
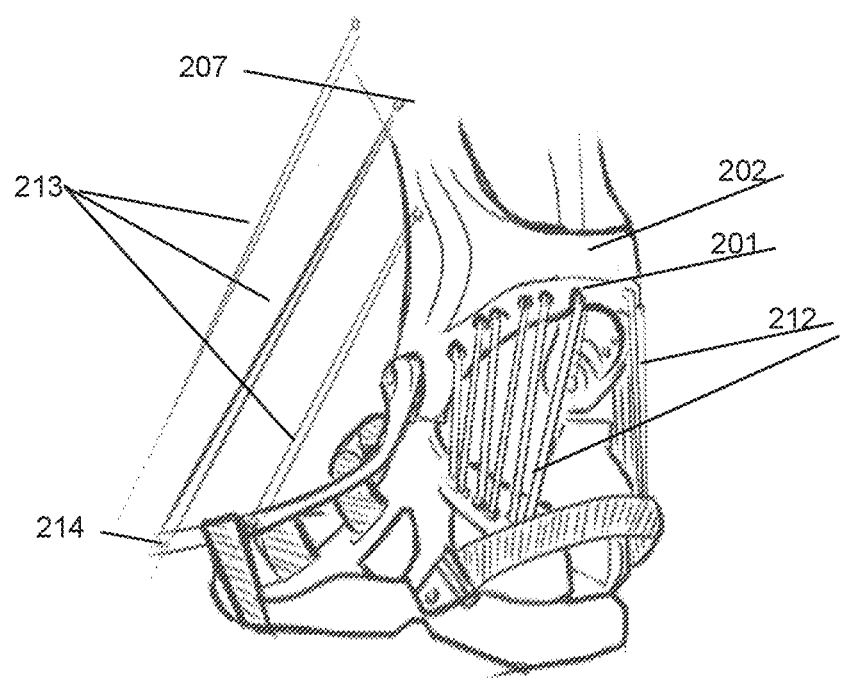
FIG. 2A—is a rear perspective that shows alternative spring elements.
Figure 2B:
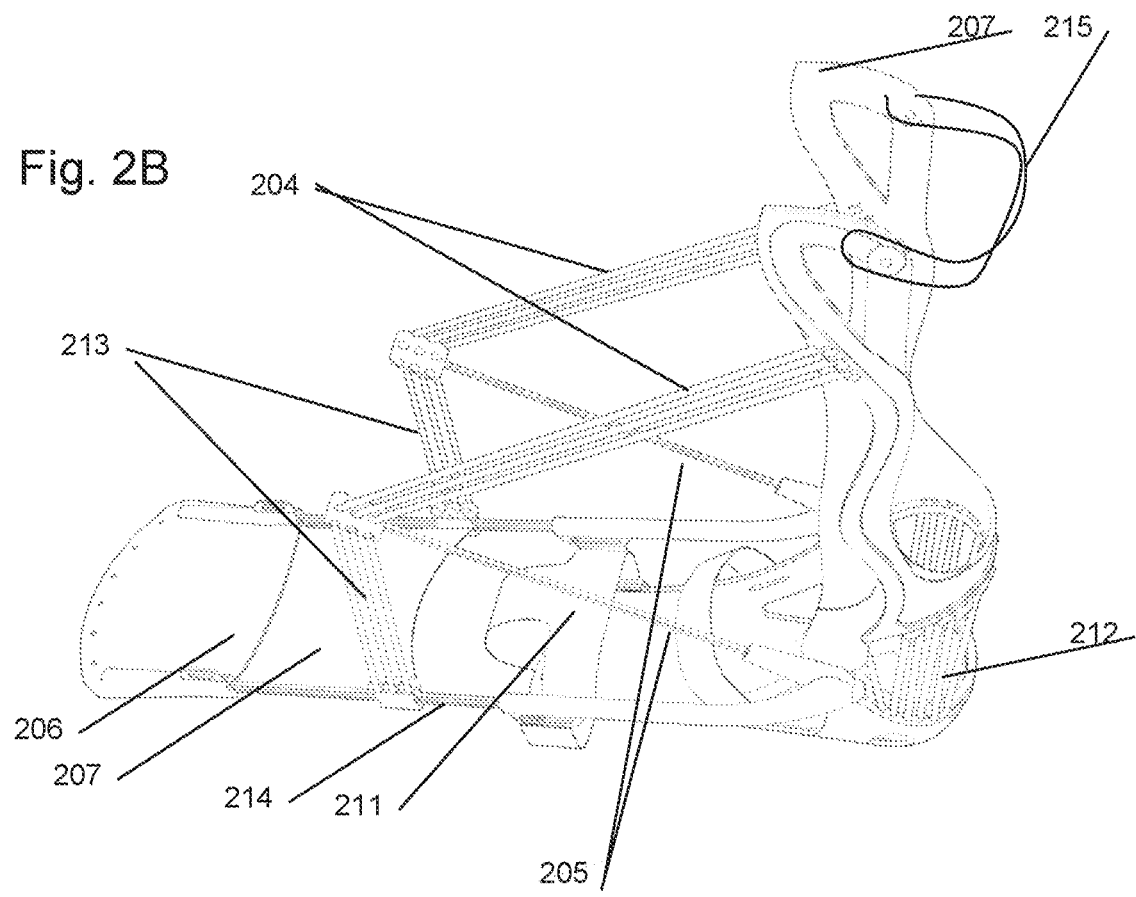
FIG. 2B is a top perspective that shows alternative spring elements.
Figure 2C:
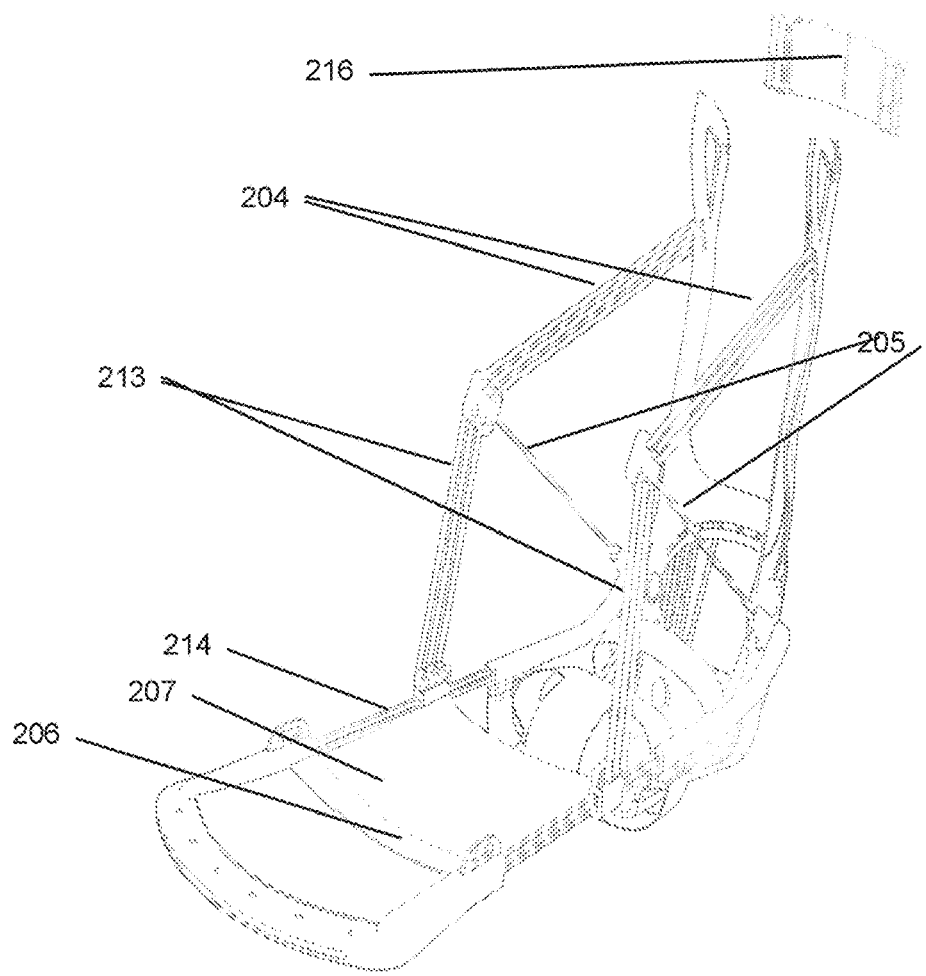
FIGS. 2C and 2D show side perspectives of a different spring element and highlight some of the straps that are germane to the initial embodiment as well as the alternate spring version.
Figure 2D:
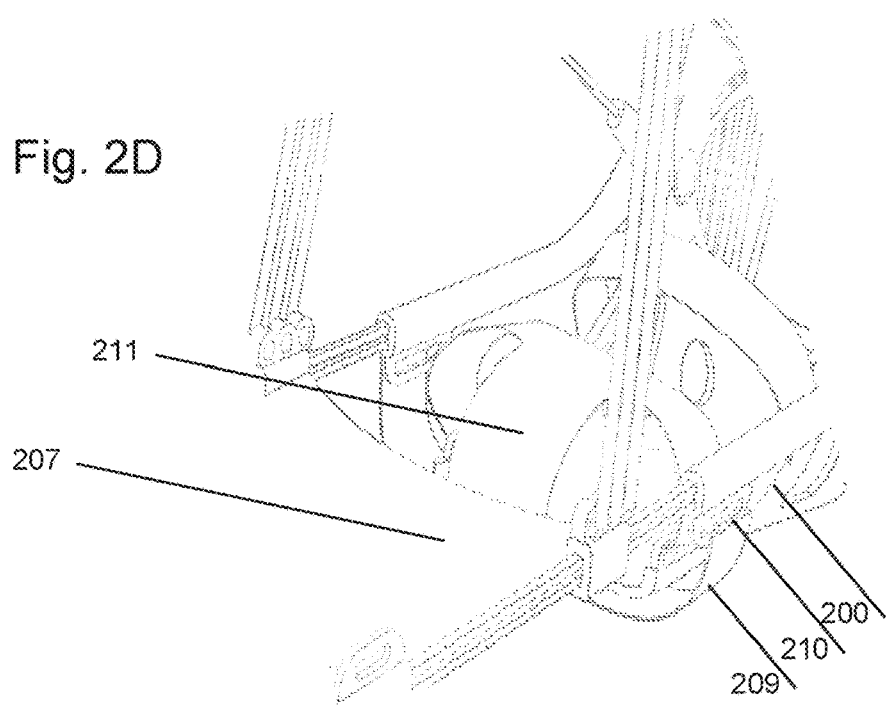
Figure 2E:
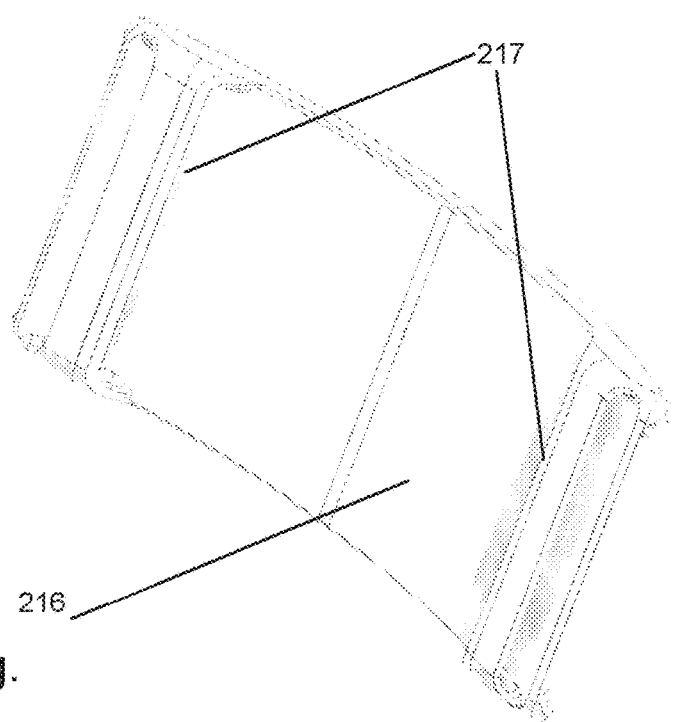
FIG. 2E is a rear perspective close-up of a shin bridge.

FIG. 2A—is a rear perspective that shows alternative spring elements. FIG. 2B is a top perspective that shows alternative spring elements. FIGS. 2C and 2D show side perspectives of a different spring element and highlight some of the straps that are germane to the first embodiment along with the alternate spring version. FIG. 2E is a rear perspective close-up of a shin bridge.

In this embodiment the biomechanical layout is the same as in FIGS. 1A-J, but bungee cords provide the elastic power. In land mode, PF spring element 212 is constructed of bungee cord and anchors using through anchor holes 201 in yoke 207. The back of yoke 207 is also shown as a contiguous hoop 202 behind the Achilles, which can allow for improved yoke dimensional stability as compared to an open back. DF spring element 213 is also constructed of elastic cords. The approach of using long cords is not optimal for safety because of a possible risk of snagging—and is not recommended for open water—but is instructive to the principles of the invention and it is easier to show this embodiment for the sake of clarity to help visualize some of the finer details that can be obscured by the dorsal fin shaped sheet spring style spring element.

In FIGS. 2B, 2C and 2D, elastic element 213 is of a different spring rate as compared to elastic element 212. Elastic element 213 together with elastic element 204 work together to create a system elastic performance. In the embodiment shown, elastic element 204 is comprised of a minimally stretchable material, such as segment of rip-stop fabric or segments of para-cord, or any other number of woven, braided, non-woven, sheet, printed or molded materials. Because of this, it allows spring element 213 to be disposed orthogonally to flipper 214. This helps maximize DF torque between flipper 214 and yoke 207.

Spring element 204 may also be designed to have a weak spring rate for its initial range of motion and then reach a limit at which point it no longer stretches. In this manner, spring element 204 can shrink when not in use and minimize volume during stowage and provide excellent geometrical positioning for spring element 213. In embodiments with two or more spring spokes 205, it opens the opportunity for a wide array of different spring rate and limit stop combinations in each of the segments between the flipper, spokes, and yoke.

This view also shows one of many ways to configure flexible blade 207 surface materials and flipper blade reinforcement 206. In this embodiment, flipper blade reinforcement 206 may have an slight concavity to help improve hydrodynamic performance.

A close up in FIG. 2D shows a preferred embodiment's strap layout. Flipper toe strap 209 is anchored to flipper 214 side rail at flipper toe strap anchor zone 210. It connects the medial and lateral side rails of flipper 214. Flipper toe strap 209 does not require a top portion, because the torque provided by the spring elements is typically greater than the force users wish to exert in the PF direction. A top portion of flipper toe strap 209 can be provided in order to provide PF torque from the foot as well as the springs, but it does not need to be cinched tight to obtain this benefit.

Base unit forefoot securement means 211 is a strap in a "T" configuration and is anchored to the base on its medial and lateral sides as well as the forward edge of the base. In this way, a foot within the base 200 is secured to prevent the foot sliding out of the base forward and to prevent the forefoot and toes from lifting up and out of the base upward.

FIG. 2E shows a rear perspective view of shin bridge 216. In this view, strap loops 217 allow passage of leg strap 215 through their openings. The distance between lateral and medial strap loops 217 establishes a minimum width that straps 215 will attempt to collapse the sides of the yoke together when straps 215 are under tension. Shin bridge 216 is formed from a semi-rigid material such as nylon, ABS, or a wide variety of plastics, polymers, cast materials, printed materials, and molded materials. The width of the distance between medial and lateral strap loops 217 can be set to the user's leg width proximal to the leg strap. Flipper blade reinforcement 206 may also provide this mechanical feature, by wrapping the strap 215 around the outer surface, it can help act as a shin bridge for the yoke.

Front surface of shin bridge 216 may include a portion of hook fabric adhered to it. In this way, the loop side of hook and loop version of strap 215 may be anchored to it—enabling both ends to meet and be adjusted.

3 High-Top Boot Version

Figure 3:
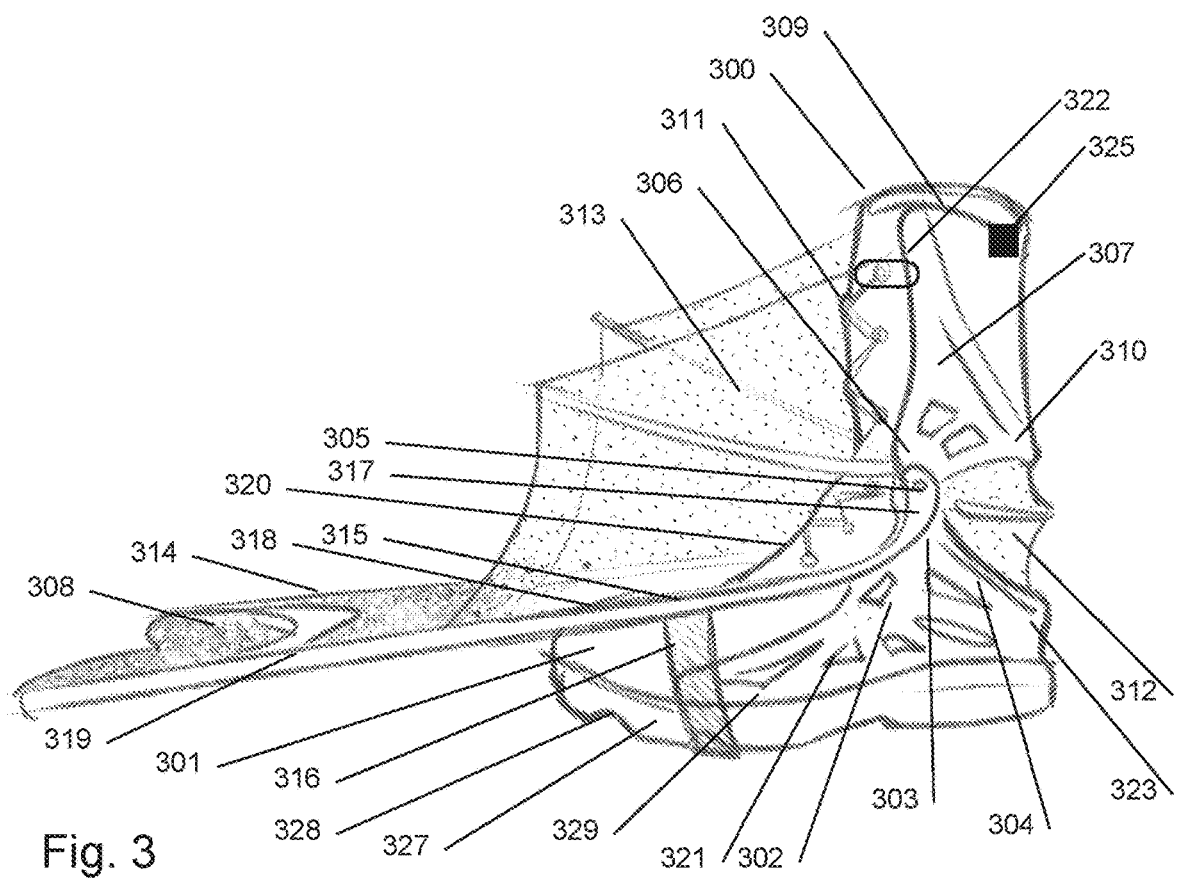
FIG. 3 is a rear perspective view of an alternative footwear configuration of the preferred embodiment in swim mode.

FIG. 3 is a rear perspective view of an alternative spring configuration of the preferred embodiment in swim mode.

300 High top footwear
    301 Base portion of footwear
    302 Base portion sidewalls
    303 Base portion hinge zone
    304 Base unit PF spring anchor zone
    305 Hinge axis
    306 Yoke hinge zone
    307 Yoke portion
    308 Flipper blade
    309 Cuff portion of high top
    310 Yoke portion PF spring anchor zone
    311 Yoke DF spring anchor
    312 PF spring element
    313 DF spring element
    314 Flipper
    315 Flipper toe strap anchor zone
    316 Flipper toe strap
    317 Flipper hinge anchor zone
    318 Flipper DF spring anchor zone
    319 Flipper side rails
    320 Footwear closure
    321 Sidewall vents
    322 Eyestay to yoke reinforcement means
    323 Heel portion of footwear
    325 Yoke anchors for flipper stowage
    327 Base unit midsole
    328 Base unit outsole
    329 Base unit plantar contour means In this embodiment shown in FIG. 3, the system is designed as a stand-alone article of high-top amphibious footwear. FIG. 3 shows the unit deployed in swim mode. Foot of a user is inserted into amphibious high-top footwear 300. The foot is held secure in the base portion 301 of the high top footwear 300 by multiple means, comprising a heel portion 323 to restrain the foot from sliding backwards and out of the base portion, footwear closure means 320 to keep the whole foot from lifting up and out of the base portion as well as forward and out of the base portion, sidewalls 302 to keep the foot from slipping sideways out of the base portion.

In this preferred embodiment, amphibious footwear 300 is created from a combination of materials such as plastics, nylons, polyurethanes, vinyls, fabrics, non-wovens or any other known material, especially those that are common in traditional and additive manufacture of footwear and flippers. Footwear 300 may also be created through a combination of materials amenable to traditional footwear manufacture as well as flipper manufacture. The materials must be able to maintain performance in wet and mud environments. The performance of said material options may be further tailored by manufacturing approach, including injection molding, 3D printing, thermoforming, vacuum thermoforming, co-molding, knitting, cut and sew, and other approaches and combinations of approaches.

The base portion 301 is constructed with sidewalls 302. Such sidewalls are of sufficient rigidity to provide geometric stability to a hinge anchor zone 303, which provides anchoring for a hinge axis 305. Forces are delivered through the hinge axis 305 and into the hinge anchor zone 303. This includes both tensile, compressive and torsional force loads. As such, the sidewalls 302 transfer force and load between the anchor zone 303 and the bottom of the base portion 301 and must have sufficient strength to resist buckling, torsional deformation, stretching and breakage. Sidewalls 302 may have inherent buckle-resistant strength through the material modulus and thickness, or there may be rib shapes or other such geometric means of strengthening, or there may be employment of supplemental means of reinforcement, such as rigid stays or other materials or layers or lattice work. Sidewalls may be further strengthened by any combination of the above. Sidewalls may be constructed of materials that are part of multiple layers of footwear upper construction. Sidewall reinforcement may be deployed through an internal exoskeleton structure between the outer footwear layer and the inner liner.

The sidewalls 302 and base portion hinge anchor zone 303 establish ability for hinge axis 305 to be positioned and maintained in close alignment with the center of sagittal plane rotation of the ankle joint. In this way, the medial and lateral hinge axis 305 may be aligned with each other, and aligned with the axis of ankle rotation.

A yoke portion 307 of a cuff portion 309 of footwear is mounted above the hinge axis 305. Said yoke portion 307 is rotatably attached on the medial and lateral sides to the hinge axis 305 through yoke portion hinge anchor zones 306.

A flipper 314 is mounted forward of the hinge axis 305. Said flipper 314 is rotatably attached on the medial and lateral sides to the hinge axis 305 through flipper hinge anchor zones 317 which are connected to the flipper side rails 319.

Base portion 301, yoke portion 307, and flipper 314 can rotate independent of each other while preferably sharing a common axis of rotation which is aligned with the ankle joint axis of rotation in the sagittal plane. The system may also employ two axes of independent rotation; an axis for the yoke portion 307 and base portion 301 for PF assist, and an axis for the yoke 107 and flipper 314 for DF assist, both of which are placed in close proximity to the ankle joint axis of rotation. In the event of having two separate axes of rotation, the PF assist would preferably be most closely aligned with the ankle joint axis of rotation, and the DF assist would be placed forward and/or above the PF assist hinge to reduce likelihood of interference.

Hinge axis 305 may be any number of means of allowing rotation between the base portion 301 and yoke portion 307, as well as between the base portion 301 and flipper 314. Such means include a stub axle which may pass through a hole in each of the base portion sidewall anchor zone 303, yoke hinge anchor zone 306, and flipper anchor zone 317. Further means comprise a live hinge system that allows each of the base portion anchor zone 303, yoke hinge anchor zone 306 and flipper anchor zone 317 to share an elastomeric bending live hinge system, ball and socket joints, barrel nuts axels, among others. The units may also be connected by an elastomeric bar hinge that enables rotation between the yoke portion and base portion together with a mechanical hinge component to enable rotation between the base portion and flipper, or any combination of hinge types known to those skilled in the art.

Sidewalls 302 may comprise sidewall vents 321 to allow rapid draining of water and faster air drying. Closure 320 may comprise a variety of means for closing the front aspects of the high top footwear 300, including shoelaces and eyelets, hook and loop closure straps, ratchet reel metallic lace closure system, elastic member closure units, buckles, rubber straps, buttons, zippers, rubber straps with cog teeth traditionally found in flipper design, The means for closure 320 is physically connected to the base portion and cuff portion to help ensure that forces from the leg are transmitted through the skeletal structure and into the various anchor zones. Such a physical connection may comprise a connector 322.

This embodiment allows for high performance midsoles 327, which may comprise foam, lattice structure or any number of means for midsole construction, as well as an outsole 328.

4 Alternate Base Configuration.

Figure 4:
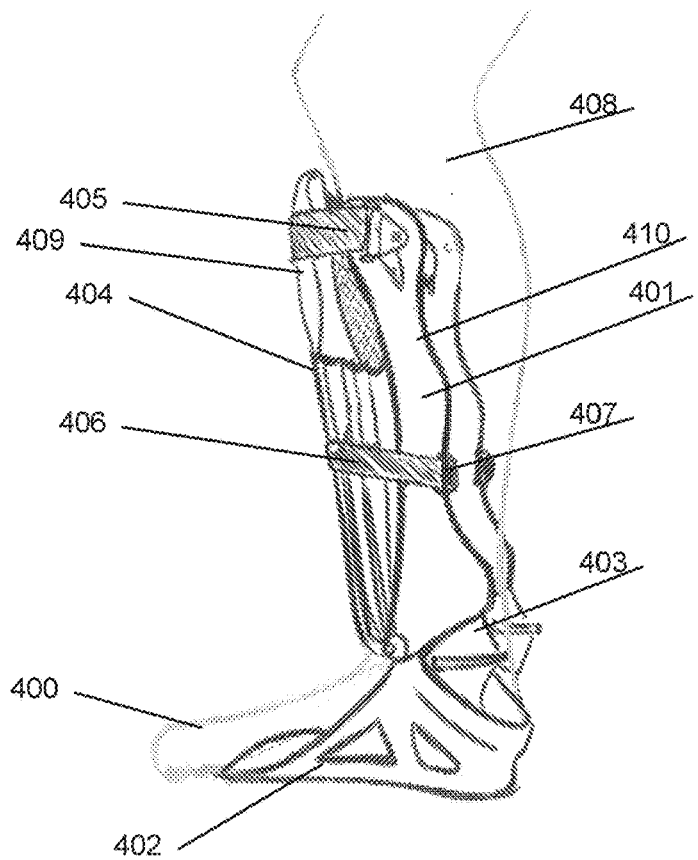
FIG. 4 is a rear perspective view of an alternative footwear configuration of the preferred embodiment in land mode.

FIG. 4 shows a side perspective of exoskeleton 401. In this configuration, an alternate base 402 is designed to be inserted into existing footwear. The closure (eg: shoelaces or Velcro) and structural fit of the footwear's sidewalls, toe area, heel area and vamp area (not shown) is responsible for the securement of the base inside the shoe, and the base to foot 400. This allows typical shoes to be converted into amphibious systems. This approach can work with all manner of footwear with sufficient closure systems to hold them on firmly, including sneakers, running shoes, hiking shoes, hiking boots, aquatic boots, military boots, and many others.

This view also shows how the toe strap 406 of flipper assembly 404 may be used to help secure flipper assembly 404 to yoke 401 by attaching to anchors 407. In this embodiment, it is envisioned that toe strap 406 would include hook and loop members, and that the reciprocal hook or loop material would act as the anchor 407 on the yoke 401 stanchion.

This view also shows yoke leg strap 405 disposed for land use on the front of the leg 408. Flipper blade reinforcement 409 provides a means for establishing a mechanical bridge to help act as a shin bridge and allows a large degree of force to be transmitted through leg strap 405 to yoke side stanchions 410 without squeezing said stanchions 410 to the sides of leg 408. Without a shin bridge, the tendency is for a leg strap to pull the medial and lateral sides of a stanchion together while under force.

Multiple Blade Embodiment

Figure 5:
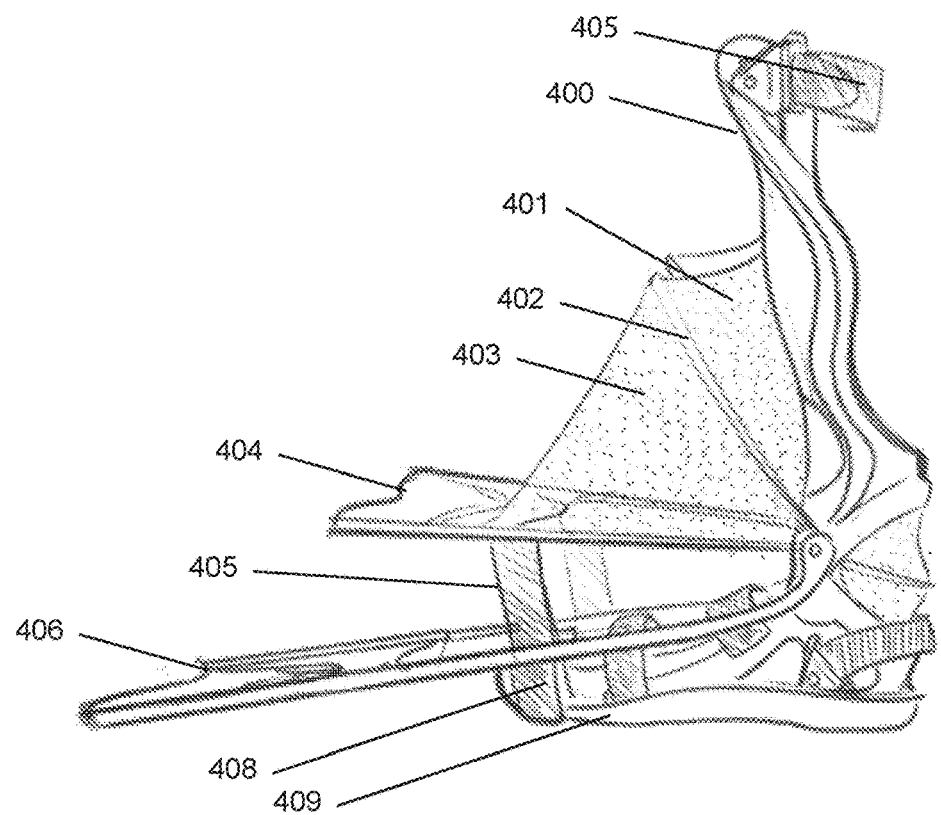
FIG. 5 is a side perspective view of an alternative flipper blade configuration of the preferred embodiment in swim mode.

FIG. 5 shows a side perspective view of an alternative blade embodiment.

In this embodiment, exoskeleton footwear 400 includes multiple blade surfaces. Primary flipper assembly 406 is disposed as in an earlier preferred embodiment. At least one additional flipper assembly 404 is positioned above the primary flipper assembly 406. This is a similar configuration to some formula racing car wings which may include 3 or more stacked wing surfaces. In this embodiment, the stacking of blade surfaces allows for greater propulsive surface area with less total length, improving improved maneuverability and power. Leg strap 410 is shown disposed to the rear of the leg.

Dorsal fin style spring elements 401 and 403 are disposed above flipper assembly 404. Spoke 402 separates spring elements 401 and 403, which may be the same or different spring rate, and which may have features to limit their range of motion. For example, in the configuration, it is envisioned that spring element 401 is a 3D printed TPU element which includes a lattice structure sandwiched between two thin faces of material which have a spring rate of 1 pound per degree of rotation, and that spring element 403 is a rip-stop fabric of aramid fiber woven construction. These materials are examples, and such spring elements may be sourced from a wide array of sheet and cord options.

Toe strap 408 provides force transfer from bottom of foot through the forefoot area of base 409. Connector element 405 is positioned as an extension of toe strap 408 and may be discrete separate elements of may be a contiguous element. Connector element 405 may be a sheet fabric, such as rip stop fabric to help reduce likelihood of hooking protruding objects underwater.

Embodiment 6—Swim-Only Propulsion Exoskeleton

Figure 6A:
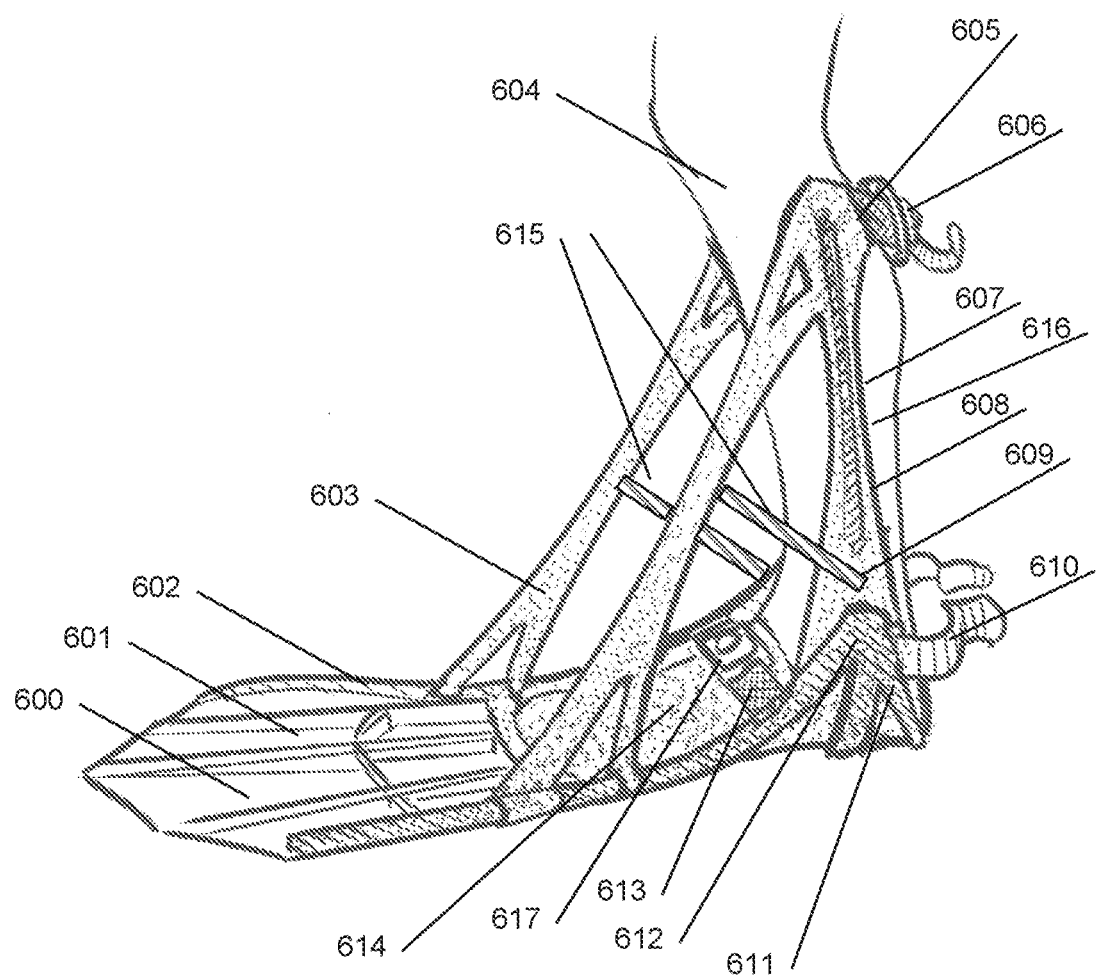
FIG. 6A is a side perspective view of another preferred embodiment
Figure 6B:
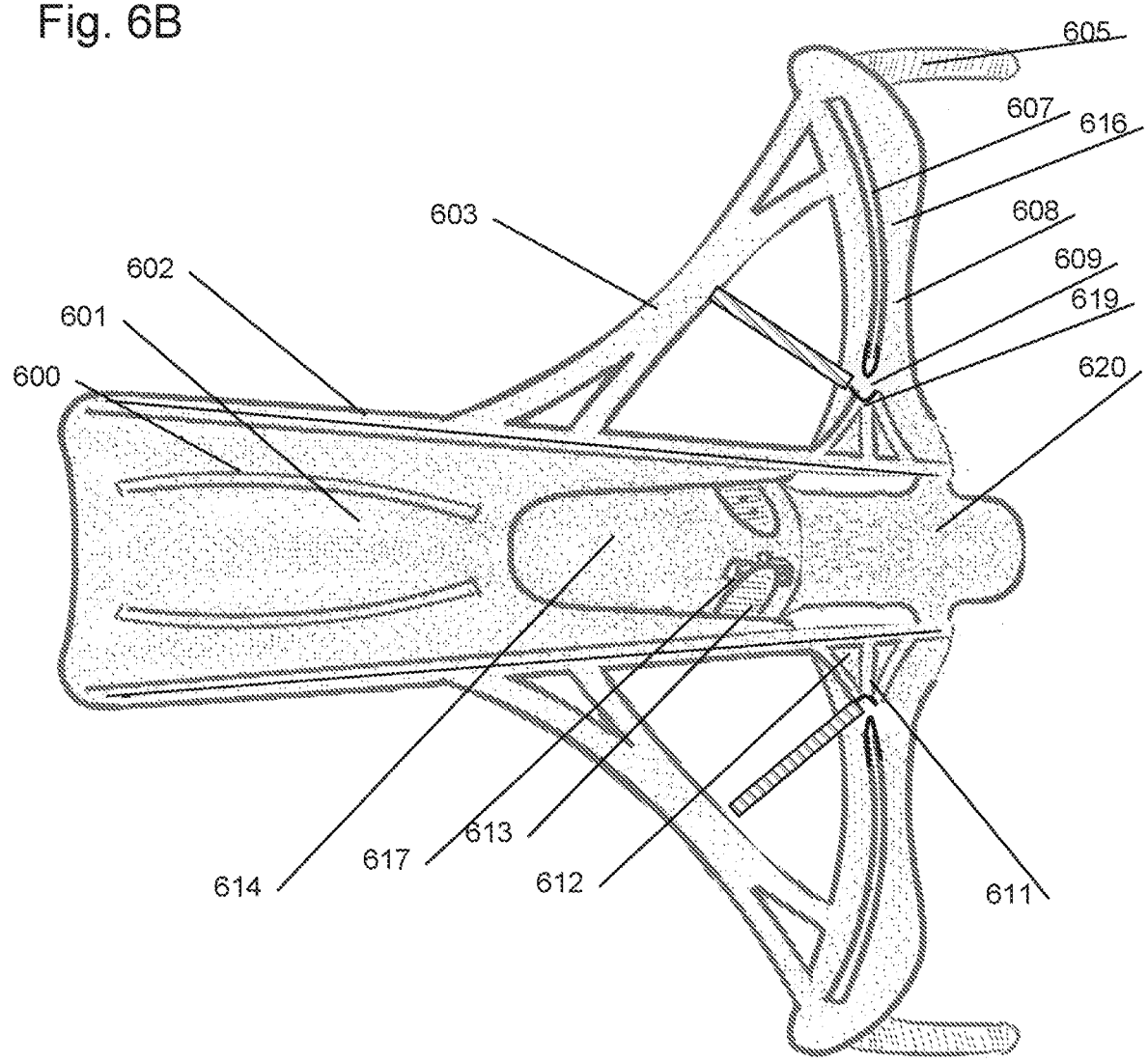
FIG. 6C is a top view of an alternative features set of the embodiment.
Figure 6C:
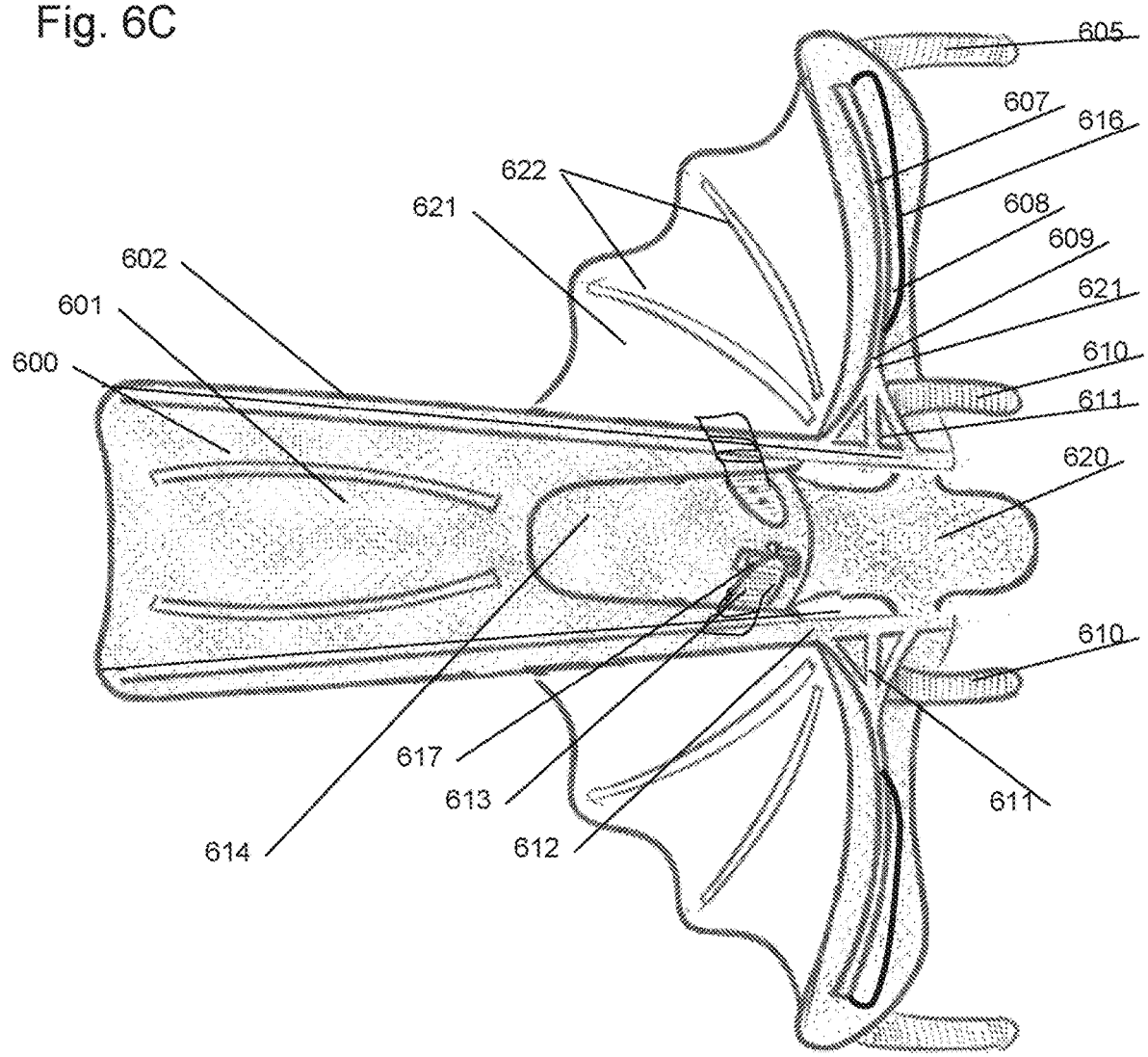

FIG. 6A is a side perspective view of another preferred embodiment. FIG. 6B is a top view of the same preferred embodiment, FIG. 6C is a top view of an alternative features set of the embodiment.

Exoskeleton flipper 600 comprises:
- a flipper element comprising propulsive blade 601, foot holder 614, and heel strap 610, as well as side rails 602, an instep strap 617, and reinforced ankle support region 611,
- vertical yoke stanchions 608 comprising stiffeners 607 and a means for securement to the back of the leg 606,
- spring elements 621 anchored to the flipper side rails 602 and vertical yoke stanchions 608, and
- a hinge zone 609 providing rotatable connection between vertical yoke stanchions 608 and flipper side rails 602, configured to augment dorsiflexion torque during the down stroke when swimming.

In this embodiment, flipper exoskeleton 600 is shown in a configuration that is amenable to high volume and low cost manufacture, typically associated with consumer level sporting goods. In this manner, one can envision a conventional flipper being made in a process that may use more traditional means of making flippers, including cavity molds, co-molding, and overmolding of different materials. Any number of traditional manufacturing or additive manufacturing or other manufacturing approaches and materials may be employed.

Exoskeleton flipper 600 includes traditional flipper elements of a blade 601, foot holder 614, heel strap 610, and side rails 602. To transition a traditional flipper to an exoskeleton flipper, a tensile spring element 603 is required. Spring element 603 is depicted as a flat band in this figure to help in depicting construction—but may be better constructed with a larger surface area within the pie-shaped opening to minimize the likelihood of snagging a submerged object as shown as spring element 621 in FIG. 6C. Tensile spring element traverses between flipper side rail 602 and the top of yoke stanchion 608. To establish a leg anchor, leg strap 606 is employed to direct force to the back of leg 604 in the upper calf area below the knee.

To eliminate the need for a circumferential band, leg strap 606 may be deployed to the back of the leg only, by the vertical support of yoke stanchion 608. Leg strap 606 is anchored near the top of yoke stanchion 608. Yoke stanchion comprises means for prevention of buckling and the maintenance of protection of skin. In this embodiment, buckling is prevented by a stiffening element 607 which may be of a wide variety of semi-rigid materials, such as polymers, carbon fiber, fiberglass, plastics, and a wide variety of other materials that are manufactured into a variety of structurally sound geometric shapes. It may also be a lattice structure designed by shape-optimization and printed with additive manufacturing. Skin protections may be improved by addition of a stanchion skin layer 615 which may be made of more elastic and elastomeric compounds. Many materials for stiffening element 607 and stanchion skin layer 615 are well known in the art of making flippers, and many other alternatives exist. Leg strap 606 may be of adjustable length, for example by buckle or hook and loop fasteners. Such adjustability allows for the adjustability of performance by varying the ankle angle at which the spring force escalates. The tighter the leg strap, the greater the spring force.

To support yoke stanchion 608, side rails 602 are modified proximal to the ankle joint to establish ankle support zone 612 for a hinge zone 609. Ankle support zone 612 receives downward force from the yoke stanchion 608 through the hinge zone 609.

To ensure stability of ankle support zone 612, several elements are taught. Ankle support stiffeners 611 provide structural connection to the side rails 602 and the base foot plate 6200f flipper 600. Together, these act to reduce downward bending and buckling of the ankle support zone 612 under load. Further support is provided by instep strap 613 which may be adjusted for tightness by instep strap adjuster means 617. Instep strap 613 establishes a vertical support for ankle support zone 612 by acting similar to a pair of suspenders over top of the foot. Instep strap 613 also provides lateral support between medial and lateral ankle support zones 612 to help prevent buckling outwards. This lateral support can be further supported by heel strap 610.

Through these multiple elements of support, downward forces from stanchion 608 through hinge zone 609 may be accepted by ankle support zone 612 with a minimum of buckling or bending.

Hinge zone 609 may be constructed in a variety of ways. In a preferred embodiment, stanchion skin layer 616 is constructed of an elastomeric material such as a thermo plastic rubber or thermo plastic urethane as commonly employed in the flipper making industry. Such a material may allow the convergence of ankle support 612 elements proximal to stanchion stiffening element 607 to create a live hinge. This may be accomplished by a wide variety of materials that allow two or more semi-rigid elements to transfer force while enabling joint rotation.

In FIG. 6B, semi-rigid yoke stiffener 607 is shown to fit into semi-rigid ankle support 612 in a 2-D ball and socket type hinge 619 supported by elastomeric materials disposed to their surfaces to maintain joint stability. In this configuration, the flipper side rails are oriented nominally parallel to the foot plate of the flipper. To establish a fulcrum for the yoke to rotate upon, the flipper side rails require a semi-rigid extension of the ankle joint support 611—in a volcano-shaped set of stanchions to establish a concave surface in immediate proximity to the ankle mortice (though inverted in shape to the mortice) into which the yoke stanchion stiffener 607 may be received.

This establishes a bowl shaped receptacle into which the side rails of the yoke may be positioned. This may be designed so that the vertical yoke rails have physical contact with the side fulcrum stanchions, or there may be a gap between that is filled with elastomeric compounds as shown in FIG. 6B.

Other hinge types may be deployed, including pin hinges, 3D hball and socket, mortice, and any number of geometries and combinations of elements and materials. Selection will be driven by trade-offs for cost, performance, longevity, style, and availability of manufacturing resources. Semi-rigid elements 612 and 607 may be hinged through mechanical connection such as a pin hinge, or they may be connected by elastomeric elements. In a recreational environment, hinge zone 609 enables a typical 50 degree range of ankle motion and 5 to 20 pounds of force. These figures augment with more professional and athletic applications.

Spring spoke 615 may be added to help maintain a an angle between spring 603 to side rail that is closer to orthogonal as a means to help maintain leverage. Without a spring spoke, the device will still work, but the amount of joint torque will diminish as the flipper is rotated near full plantar flexion. More than one spring spoke 615 may be deployed on each side.

Springs and spring spokes are shown on medial and lateral sides of each foot—but a similar design objective may be accomplished with a single spring and yoke stanchion along the midline of the foot and leg as a means to reduce cost and improve water flow. In such a configuration, said single stanchion would require a fork near the base to help establish a pathway to ground. Lower performance variations could allow the stanchion to be vertically supported by the instep of the foot, but this is not ideal and it limits how much force can be transmitted.

FIG. 6C shows how a combination of a torsion bar spring and hinge 621 may be constructed by extending the semi rigid elements of ankle support 611 to a contiguous connection to yoke stiffener 607. Such a device may also be called a sort of live hinge by some people. This would reduce the need for as strong of a spring rate in the front tensile springs and provide the ability to establish dorsiflexion assisting torque in the ankle joint area of hinge zone 609, proximal to the ankle joint axis of rotation. One can also envision an alternative without tensile spring elements. For example developing torque only by such a torsion bar spring and hinge 621 mounted adjacent to the ankle joint which provides a viable option. Metallic torsion springs have sufficient strength but are likely to rust and not ideal.

FIG. 6B also shows a top view of how a device may be constructed in one or more flat molds and common in a typical flipper manufacturing process. The medial and lateral yoke, DF spring assemblies and flipper rails may be constructed nominally flat. For example medial and lateral yoke elements may be constructed in a separate mold or molds. Elements from separate molding processes may be affixed together by various means, including adhesives, bonding, fastening among various other approaches. After manufacture, they can rotate up to their operational position. Instep strap 613 and instep strap closure means 617 can help pull the medial and lateral sides together to maintain their vertical positioning during use. This is further supported by heel strap 610 and leg securement means 605.

DF springs may be modeled as strap type springs 603 as shown in FIGS. 6A and 6B—thereby connecting the yoke side rails near their top, to the flipper side rails near the toe of the foot. Or they may be modeled as dorsal fin springs 621 as shown in FIG. 6C.

The bottom foot plate of the flipper is extended in this design to reach the full length of the heel 620. In this way, downward force from the heel can be transferred into the back of the foot plate, and the side rails 602 may be extended the length of the foot, reducing the bending moment while under downward load from the hinge zone 609. The force in the foot plate may also be transferred into the side rails behind the ankle hinge required during aggressive up stroke during swimming which exceeds the power of the DF spring contribution to manage the torque during the plantar flexion of the foot and keeping the flipper assembly from wobbling.

The strap around the lower leg may be helpful for reasons of comfort. It is not shown in FIG. 6B, but is shown in FIG. 6C. This strap would go around the lower leg above the ankle to help provide comfort and security while not swimming. While swimming, the pull of the springs would keep the flipper secure to the foot.

7—Umbrella Inspired Collapsible Swim Version.

Figure 7A:
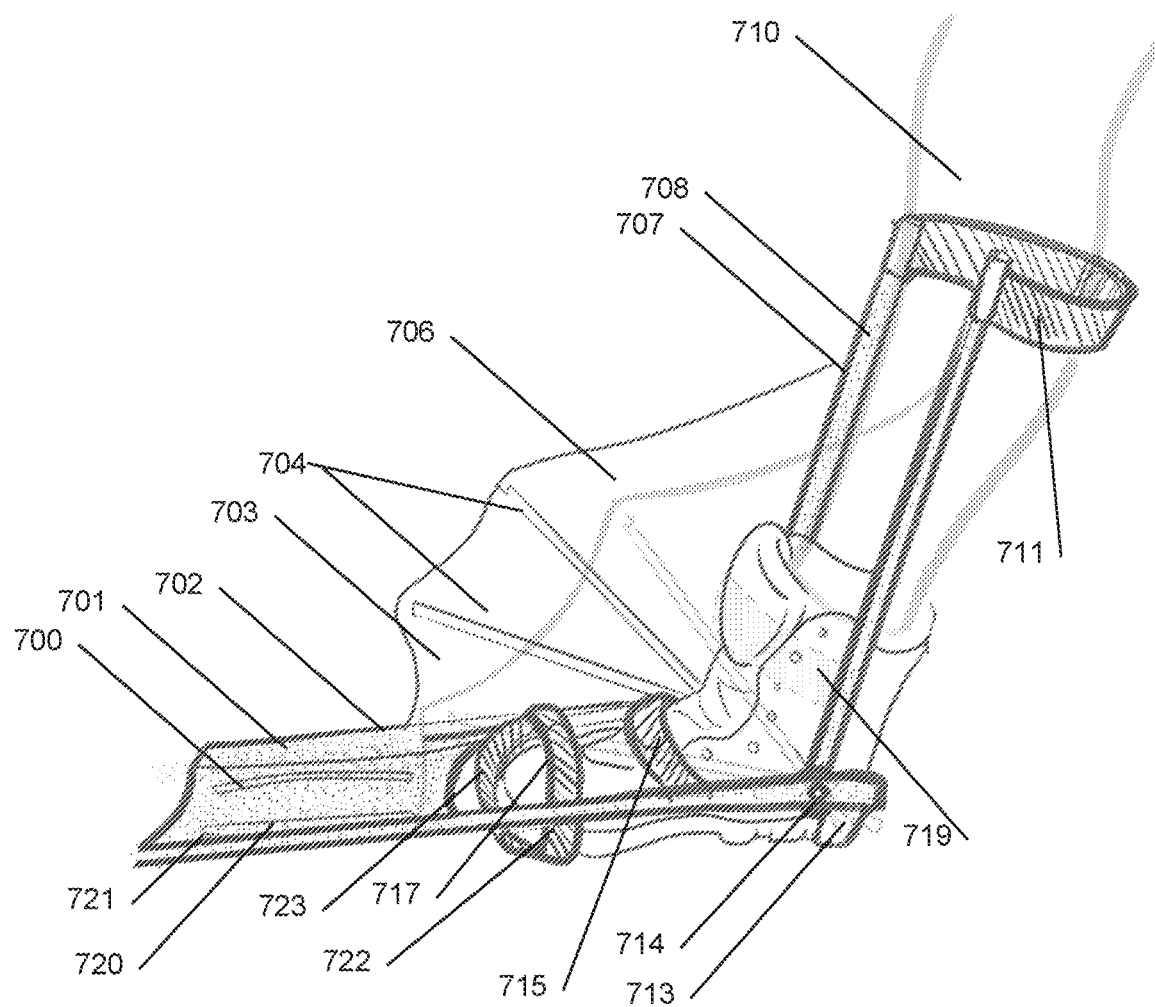
FIG. 7A shows a side perspective drawing of a swim only version.
Figure 7B:
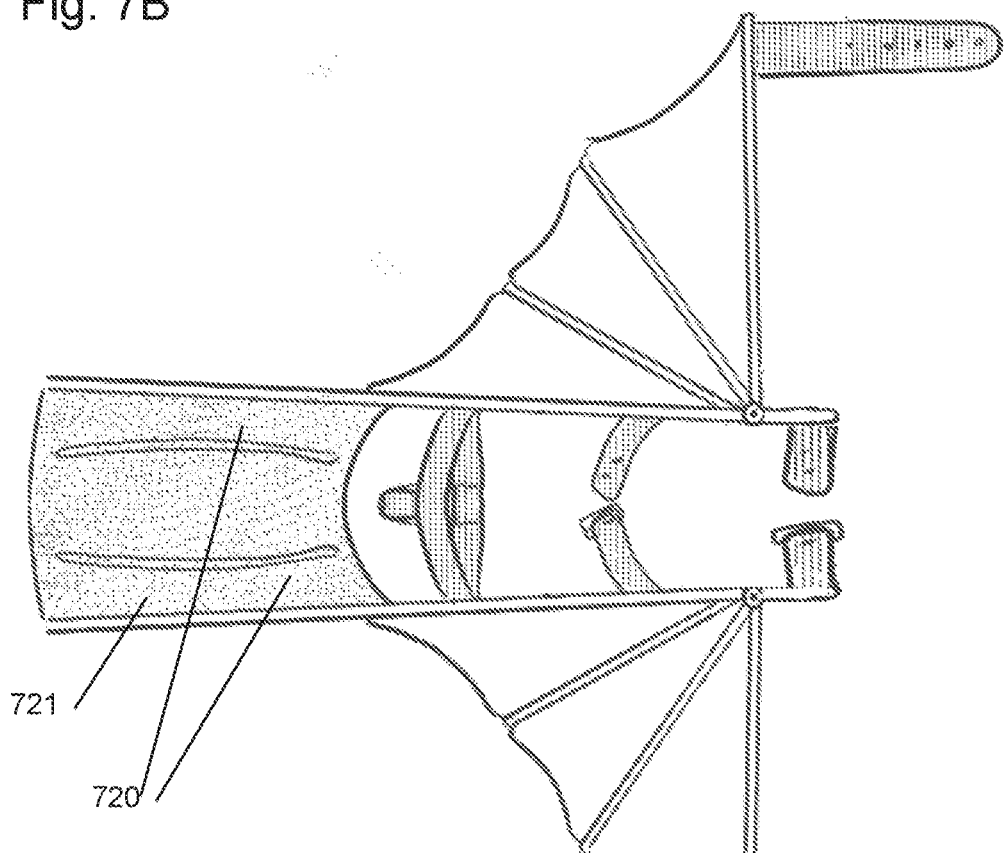
FIG. 7B shows a top view of this swim only version.
Figure 7C:
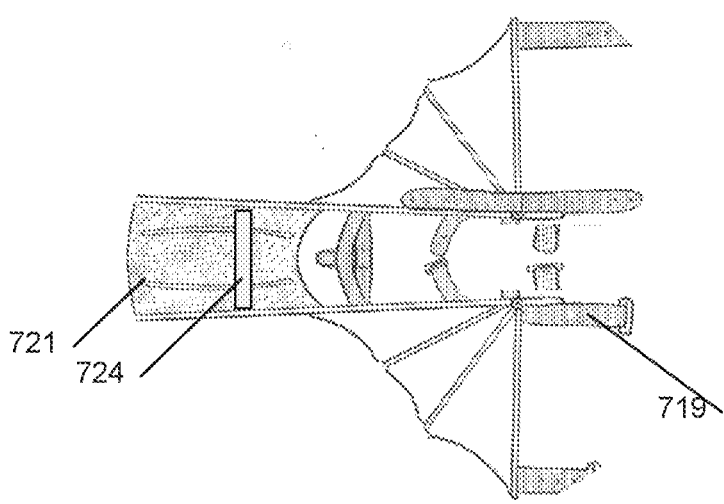
FIG. 7C shows a top view of another configuration.
Figure 7D:
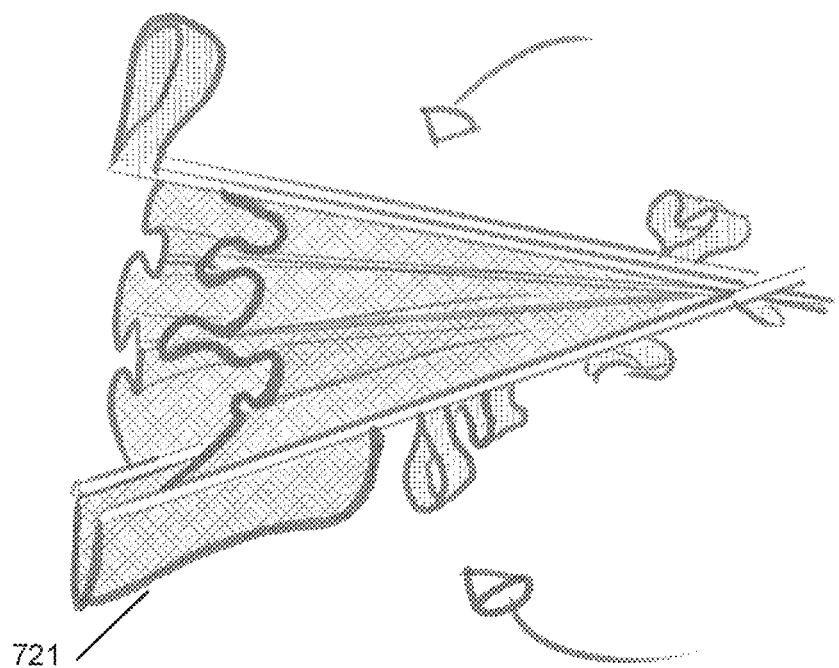
FIGS. 7D and 7E show a side perspective view of the configuration prepared for storage, 7 F and 7G show the configuration with additional collapsible elements.

FIG. 7A shows a side perspective drawing of a swim only version, FIG. 7B shows a top view of this swim only version, FIG. 7C shows a top view of another configuration. FIG. 7D an 7E show a side perspective view of the configuration prepared for storage, 7F and 7G show the configuration with additional collapsible elements.

FIGS. 7A through 7E show a collapsible swim-only version, that is easily stored like an umbrella. Such a configuration can slip over a bare foot, a boot or other footwear. In this version, the question being explored is "what is the smallest size and weight that one can fold an exoskeleton flipper when not in use", as a means to make a device suitable for military special operators as well as divers and snorkelers who want to travel light.

To minimize volume while stowed, rail elements described are straight and narrow rods. The side rails of the flipper are hinged to the vertical rails of the yoke. The hinge is placed in proximity to the ankle joint axis of rotation. Straps are designed to maintain the intersection of the rails (hinge) at the ankle joint. As such, the flipper side rails traverse the side of the foot diagonally and not parallel to the plantar base surface of the foot. This improves hydrodynamic performance at less than full plantar flexion, which is easier on muscles and affords more power. The flipper side rail also extends behind the hinge to provide securement for a heel strap.

Broadly, the device may be characterized as an easily stored exoskeleton flipper assembly 721, which comprises:
  a flipper assembly 700 comprising side rails 702, a propulsive surface area 701, and
  a means for securement to the foot,
  a vertical yoke assembly 708, comprising vertical rails 707 and means for securement 711 to the back of the leg 710 above the ankle,
  a means for rotational connection 714 between said flipper blade assembly 700 and vertical yoke assembly 708, wherein the axis of rotation 714 is aligned with the ankle joint, and
  a means for creating dorsiflexion assisting spring torque between the vertical yoke and the flipper side rails.

In this embodiment—easily stored exoskeleton flipper assembly 721 is described.

Said side rails 702 and vertical rails 707 may be constructed of a variety of materials and approaches, in one preferred embodiment, they are constructed as 8 mm×4 mm rectangular carbon fiber rods, and they may also be constructed of fiberglass and other composite materials, metals, alloys, plastics, and various combinations of semi-rigid and/or rigid materials. The quality of the rods are that they must be able to withstand the propulsive forces through the exoskeleton and resist buckling, breaking, excessive bending, and other failure modes, while being lightweight, rust free and able to endure salt water exposure.

Said propulsive surface area 701 may be constructed of durable fabric, cut to a geometry that optimizes hydrodynamic efficiency. By observing patterns for sail making, one can better understand the geometry of how to drape and allow sail cloth (a rip stop fabric) to capture fluid pressure and establish a foil geometry conducive to propulsion. In this way, an easy to fold fabric may be cut, sewn and attached to the side rails in a manner that offers optimal propulsion through both angle of attack as well as hydrodynamic flow. Said propulsive surface area is suspended between medial and lateral side rails distal to the ankle joint. They may benefit from stays 720 sewn in to optimized hydrodynamic shape while still enabling the fabric to stow easily along the side rails when not in use. An optional side rail stabilizer 724 may be helpful in keeping the side rails from bending inward too much and reducing cross sectional surface area. Such a stabilization effect is provided by the foot or boot which helps maintain a separation between medial and lateral sides. Additional separation may be helped by a bridge device to maintain separation between the side rails beyond the front of the foot. Fabrics may include rip stop woven fabrics, knit fabrics, non-woven fabrics, sheet films, cast sheets, 3d printed sheets, among a wide variety of other options which may be suitable.

Said means for securement to the foot, includes a "T" strap toe cup to secure the forefoot in up and down directions as well as preventing the front of the foot from escaping forward and out of the device. The "T" strap has cross-straps 717 and 722 to attach to the medial and lateral side rails. In the preferred embodiment there are two cross straps—one to traverse below the foot 722, and one to traverse across the top of the foot 717. The cross straps 717 and 722 anchor to each of the medial and lateral side rails 707. At their mid-point, a mid-strap 723 connects the top cross strap 717 with the bottom cross strap 722 and traverses forward, creating a "U" shaped pocket for the toe and forefoot. Viewed from above, this appears to be a "T" shape. The assembly may be tightened for proper fit, but it does not require cinching to provide functional securement of the forefoot.

An instep strap 715 secures the top of the foot to the side rails 702. Said instep strap 715 prevents the foot from escaping upward while under load. Said in another way, instep strap holds hinge zone 714 in close proximity to the ankle joint axis of rotation.

A heel strap 713 manage upward foot plate forces during aggressive upstroke in swimming, which exceeds the power of the DF assist spring torque.

Side rails 702 constrain lateral foot motion to help secure the foot within the device. The yoke 708 and spring force provide additional means of securing the foot in the device.

Collectively, these "T" strap, instep strap, heel strap, side rails, yoke and spring force help stabilize and provide means of securement of the foot inside the device.

While swimming in choppy water, additional stabilization of the foot may be aided by an optional ankle strap 719 which may be deployed around the whole ankle, front of the ankle, or back of the ankle. Said strap does not need to be cinched tightly for it to properly operate.

Said vertical yoke assembly 708 comprises vertical rails 707 and means for securement to the back of the leg 710 above the ankle. Means for securement allows force from the leg to be connected to the vertical rails, enabling a torque moment arm to be established which helps dorsiflex the flipper assembly 700. Said means for securement of the vertical rails is shown in this embodiment as a leg strap 711 which can be a hook and loop enabled strap and D ring assembly attached to the vertical rails in an area proximal to the top of the calf muscles of the leg 710. Such a means for securement may also include a semi-rigid concave element, belts with buckles, a strap with a semi-rigid shin-bridge as described earlier, where said shin bridge is of approximately the same width as the leg at that elevation, and a wide variety of other means. Said means for securement may also provide a convenient strap to hold the device together when stowed.

Said means for rotational connection 714 between said flipper blade assembly 700 and vertical yoke assembly 708 is shown in this embodiment as a hinge 714. Said hinge 714 is located to align with the ankle joint axis of rotation in the sagittal plane. A wide variety of hinge mechanisms may be used, comprising a pin hinge, stub axle, and many other mechanisms and approaches for enabling rotation between two rails. Means for rotation should allow for a neutral position at approximately −5 to +5 degrees of plantar flexion, beyond this a spring will engage and allow for a maximum range of motion a bit beyond 55 degrees plantar flexion. When stowed, the rails should collapse and be parallel (eg: approximately 90 degrees of dorsiflexion), minimizing storage volume. Means for rotational connection also must be able to transfer significant downward force from the vertical rails into a hinge and into the side rails. Downward forces in the aft portion of the side rails can be managed by the instep strap 715.

Said means for creating dorsiflexion assisting spring torque between the vertical yoke and the flipper side rails may be delivered in a variety of ways. In the embodiment shown, dorsal-fin shaped tensile spring elements 703 are disposed between the vertical rails and side rails. Said dorsal springs 703 may be further supported by optional radial spring spokes 704. Spring spokes 704 rotate with a common axis as the vertical rails 707 and side rails 702, but also may have an adjacent center of rotation. Presence of the spring spokes 704 preserves the moment arm, to support strong torque, especially when the foot is near full plantar flexion. Dorsal springs 703 may comprise different spring qualities in each of the segments that is created between the horizontal rails 702, spring spokes 704 and vertical rails 708. In this example dorsal spring 703 segment 706 is a weak spring that reaches a limit at which it is restrained from further expansion.

Means for creating dorsiflexion assisting spring torque between the vertical yoke and the flipper side rails may also be delivered in other ways—for example the side rails and vertical rails could be a contiguous element designed to flex along the axis of the ankle joint, metallic torsion springs may be employed, gas cylinders could be employed, and a wide variety of other means may be employed. For recreational use—spring forces of 0.1 to 0.5 foot pounds per degree of dorsiflexion is appropriate, while for professional and military divers, a spring rate of 0.5 to 3 foot-pounds per degree of dorsiflexion is appropriate.

FIGS. 7B and 7C show the device laid flat. The yokes are moved upward to vertical when in use. FIG. 7C shows optional ankle strap 719 that is not biomechanically required for propulsive force transfer, but may help secure the device in waves and turbulent water. Similarly, the toe box is designed to be non-constrictive, as cinching tight is not necessary for biomechanical force transfer, but may be snugged for securement from ocean waves.

Figure 7E:
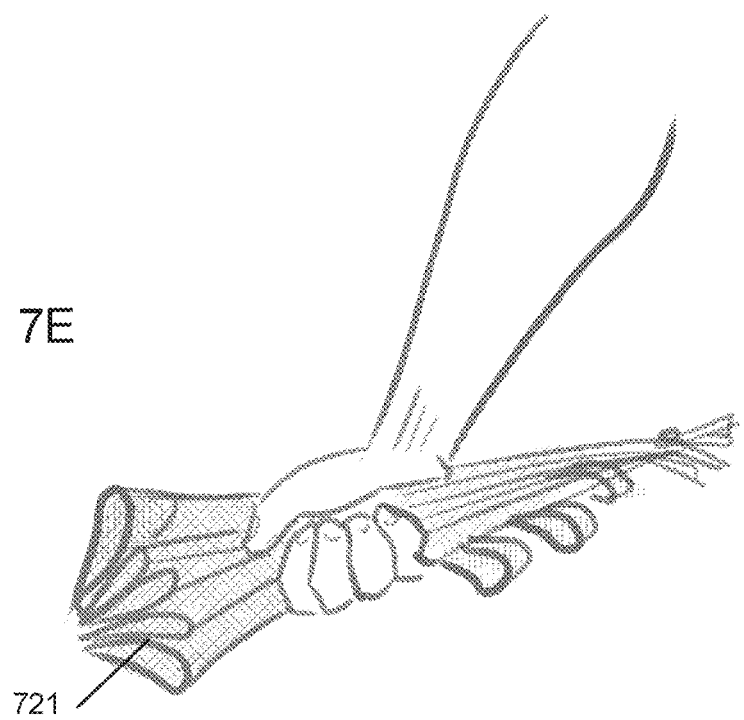

FIGS. 7D and 7E show how the device may be collapsed like an umbrella and stored with minimal volume and weight.

Figure 7F:
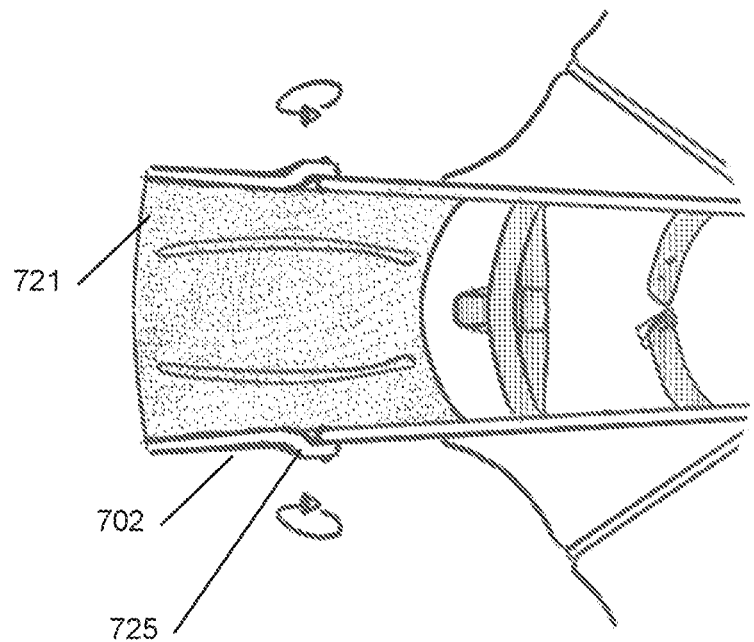
Figure 7G:
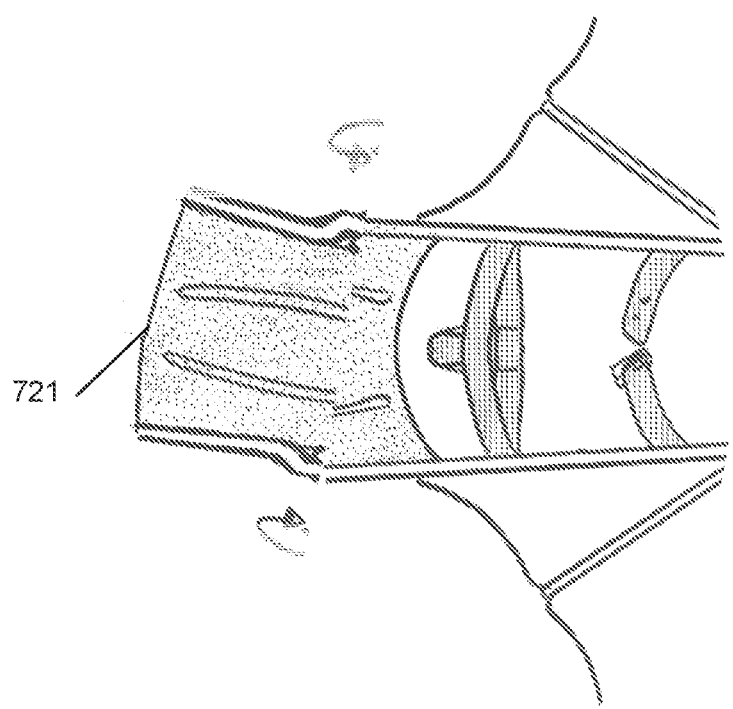

FIGS. 7F and 7G show how the umbrella version may be stored in a smaller volume by establishing a means for shortening side rails 702. In this embodiment, side rails include a hinge 725 to enable flip up and flip down of the side rails. Similarly the side rails 702 may be shortened by using telescopic elements or other means known to those skilled in the art.

When swimming, user plantar flexes and stretches dorsiflexion assisting spring elements during the up stroke. During the down stroke, elastic potential energy in said spring elements 703 is released and augments and accelerates dorsiflexion torque, increasing swim propulsion.

8 Retrofit Umbrella Version

Figure 8:
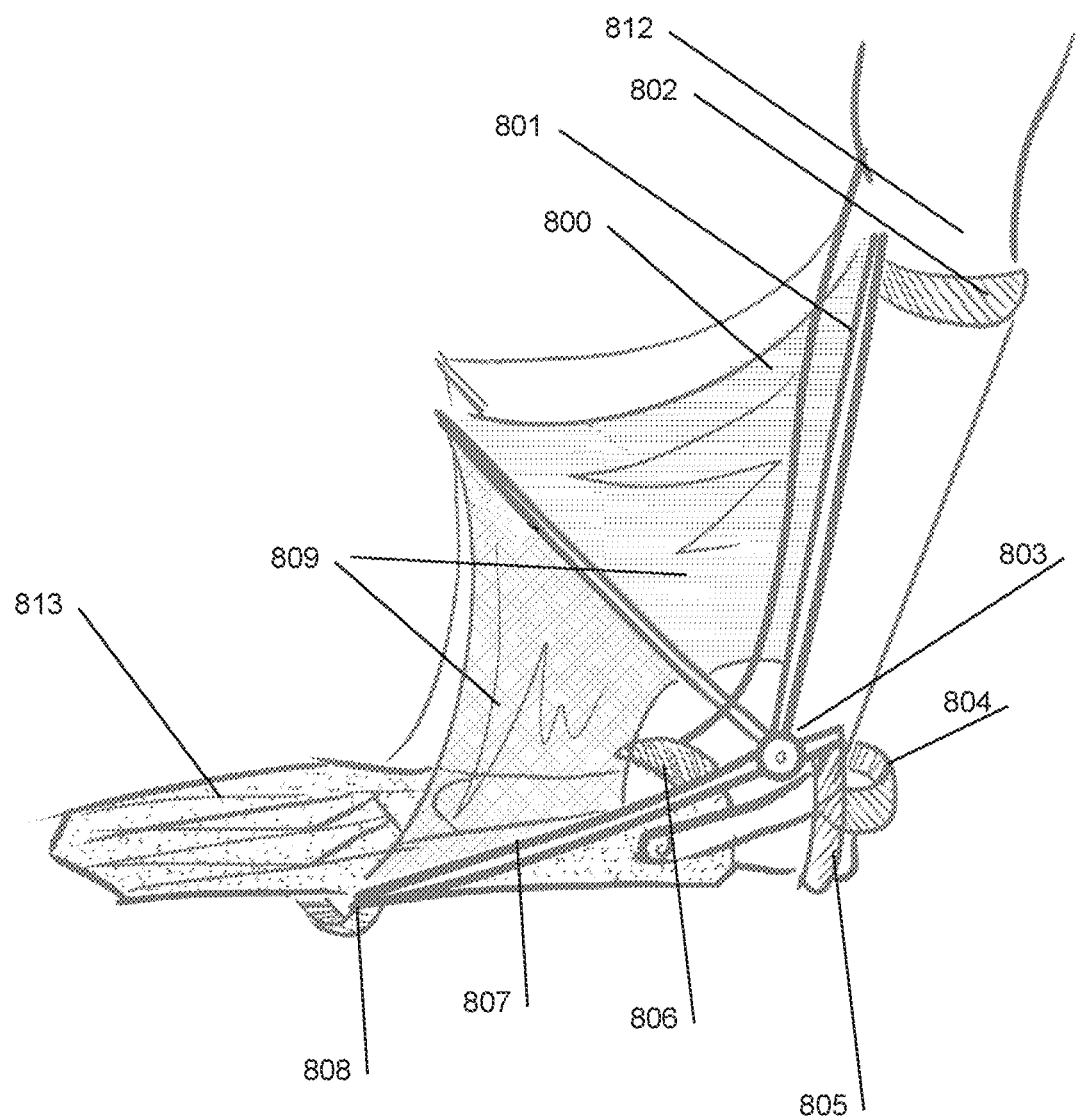
FIG. 8 shows a perspective side view of a collapsible flipper exoskeleton.

FIG. 8 shows a perspective side view of a collapsible flipper exoskeleton. Similar to the umbrella version of drawings 7A-7G, a version of the device may be created for people wishing to employ an existing pair of flippers. In this version, the mechanics are very similar.

People wishing to continue to use their traditional flippers 813, may don this collapsible flipper exoskeleton 800. Collapsible flipper 800 comprises:

side rails 807 designed to resist buckling and carry forces,
a toe strap 808 at the forward distal end of side rails 807, which traverse under the toe box region of flipper 813 from medial to lateral side rails 807,
a vertical heel strap 805 at the aft distal end of side rails 807, which traverse under the heel region of the foot or flipper 813 from medial to lateral side rails 807,
a horizontal heel strap 804 at the aft distal end of side rails 807, which traverse behind the heel region of the foot or flipper 813 from medial to lateral sides of vertical heel strap 813,
vertical rails 801 designed to resist buckling and carry forces,
a leg strap 802 to harvest force from the rear of leg 812 behind the calf muscles,
a hinge 803 to enable rotatable connection and force transfer between side rails 807 and vertical rails 801 with the axis of rotation aligned with the ankle joint axis of rotation in the sagittal plane
a dorsiflexion assisting spring element 809 disposed between side rails 807 and vertical rails 801 forward of the ankle joint,
wherein a traditional flipper 813 is secured to the user's foot and also secured between said side rails 807, toe strap 808, and an instep strap 806. Said instep strap 806 capable of supporting the side rails 807 which in-turn support hinge 803 and the downward vertical forces through vertical rails 801.

When swimming, user plantar flexes and stretches dorsiflexion assisting spring element 809 during the up stroke. During the down stroke, elastic potential energy in said spring element is released and augments and accelerates dorsiflexion torque, increasing swim propulsion.

Figure 9:
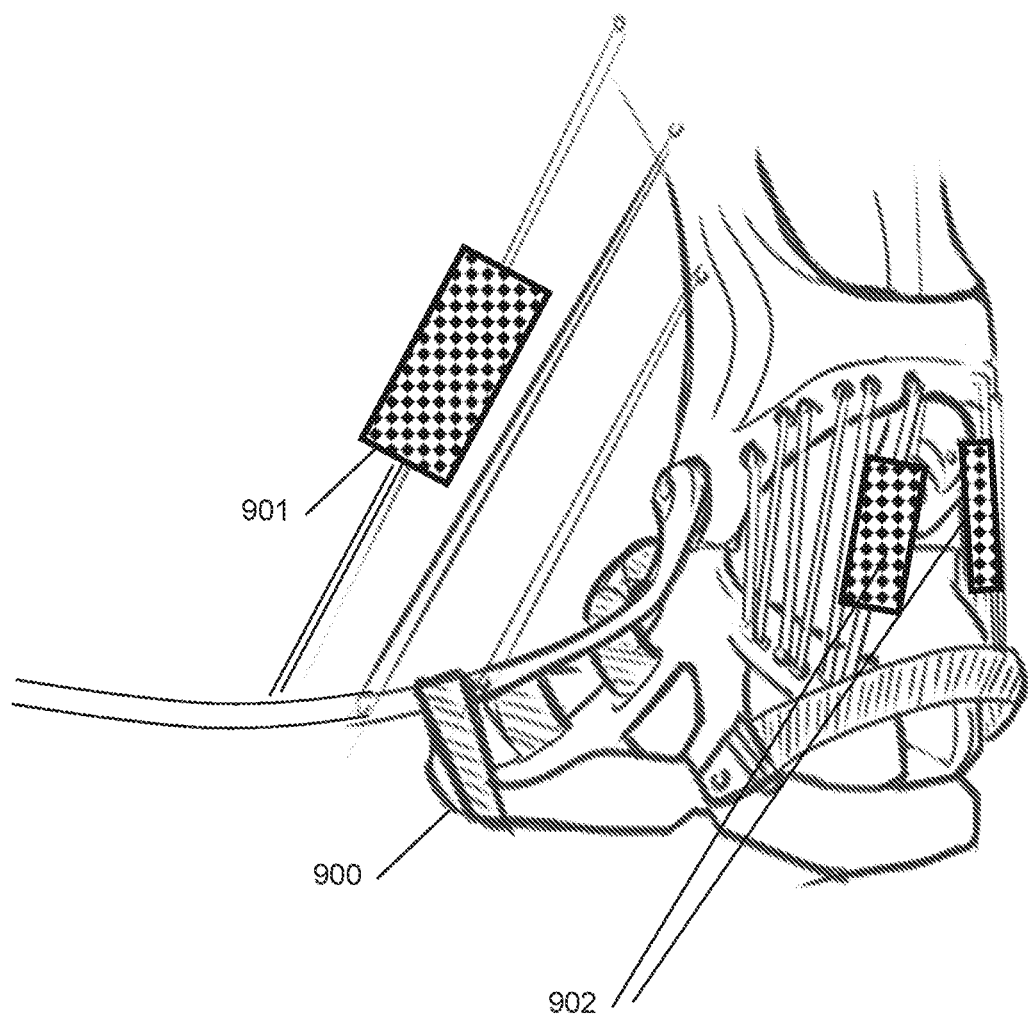
FIG. 9 shows a side perspective view of an exoskeleton flipper system with electronic augmented features.

Interactive Version—FIG. 9

FIG. 9 shows a side perspective view of an exoskeleton flipper system with electronic augmented features, assisting flipper device.

Powered actuators, power harvesting devices, sensors and accessory drives can be integrated into either or both of the PF and DF spring assemblies of exoskeleton swim footwear 900. In this embodiment, linear actuators 901 and 902 are placed both in series and parallel to bungee cord springs. Using power and computer control, such actuators can engage to augment joint torque in the desired direction. Sensors that monitor swimmer location can be placed in the same location to monitor biomechanical performance, GPS location, water depth, water temperature, etc.

10 Cantilever Yoke Versions

Figure 10:
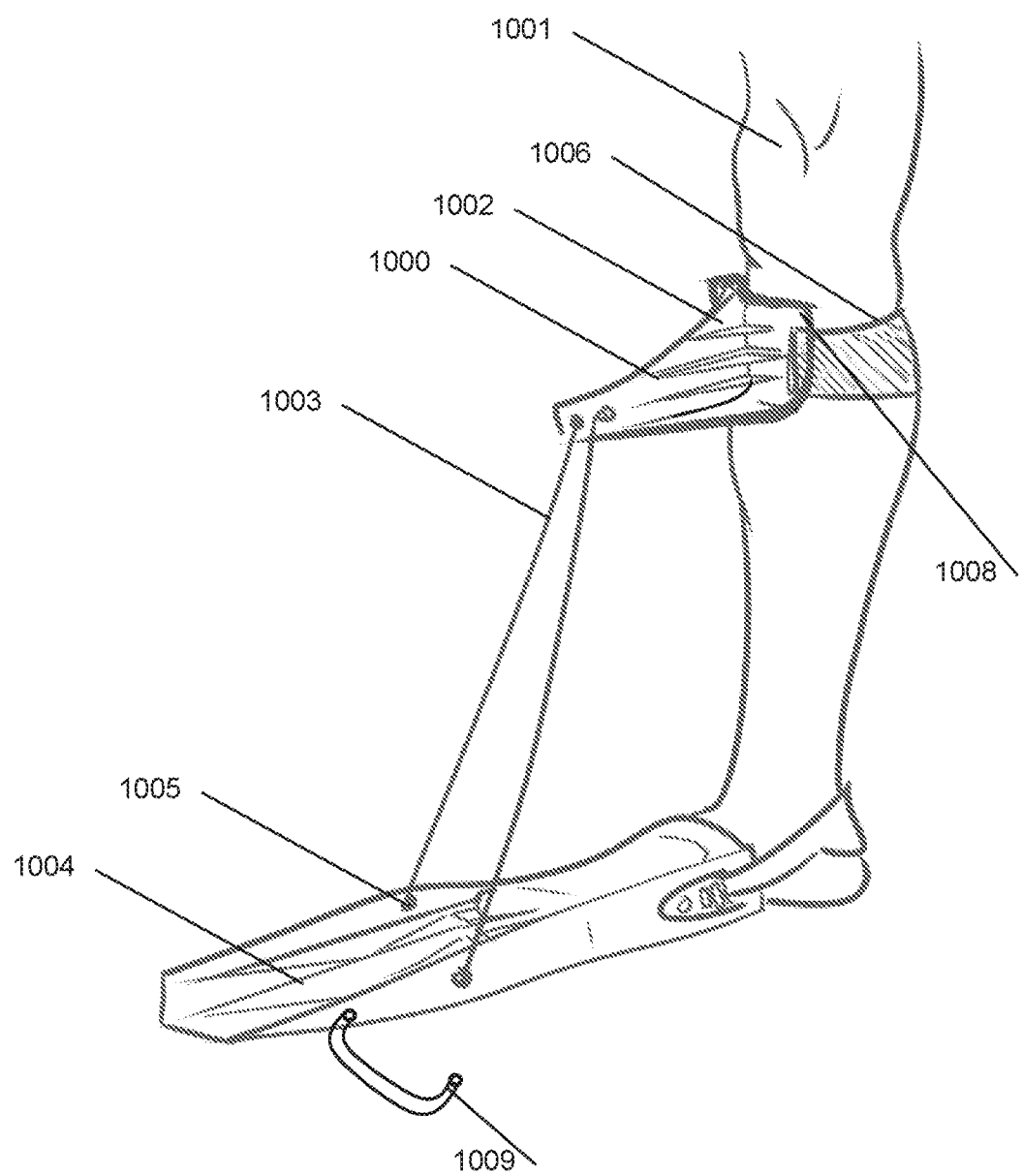
FIG. 10 shows a side perspective view of a cantilevered dorsiflexion assisting flipper device.

FIG. 10 shows a side perspective view of a dorsiflexion assisting device.

This version relies upon the ankle joint and lower leg bones (tibia and fibula) and foot bones to manage the compressive and rotational elements of establishing a joint torque in the foot.

This can establish an unwanted amount of force on the soft tissues, constrict blood flow, chaff the skin, introduce pain and be an unreliable method of anchoring forces. But because it is very low cost it is listed here for completeness and an another solution to improved flipper propulsion.

A leg supported flipper propulsion device 1000 is taught, which comprises:

a cantilever leg anchor 1002, secured to leg 1001 by means of a leg strap 1006,
a dorsiflexion assisting spring element 1003, and
a spring securement means 1005
which are deployed to support dorsiflexion of a traditional flipper 1004.

During the up stroke, said flipper 1004 is plantar flexed thereby stretching dorsiflexion assisting spring element 1003 and creating stored elastic potential energy. Stored elastic potential energy is returned during the downstroke to augment and accelerate dorsiflexion of the foot and flipper 1004, thereby increasing propulsion while reducing metabolic demand.

In this embodiment of a flipper propulsion device 1000, the superior portion of spring element 1003 is anchored to a cantilever leg anchor 1002. Said cantilever leg anchor 1002 is positioned on the front of leg 1001 above the above the top of the calf muscle, where a leg strap 1006 can wrap around the back of the leg 1001 and the increasing girth of the calf muscles can help keep it from sliding down the leg. The lower portion of the spring element 1003 is anchored to the flipper 1004 in the region forward of the toes and metatarsal heads by spring securement means 1005.

By making this connection between the toe region of the foot/flipper 1004 and the upper shin of the leg 1001—the spring element 1003 spring stiffness rate may be calibrated to a desired performance level. Force can be exerted to stretch the spring during up stroke plantar flexion that is returned during down stroke dorsiflexion.

Said cantilever leg anchor 1002 is designed with a radius curve at the base of the unit in contact with the leg. Spring element 1003 is anchored at the forward distal end of the cantilever leg anchor 1002. Downward force exerted on the cantilever leg anchor 1002 creates a moment arm, with the radius base creating a fulcrum between the cantilever leg anchor 1002 and the shin of leg 1001. Padding 1008 is placed between cantilever leg anchor 1002 and shin of leg 1001. The torque established by the cantilever establishes a forward pull on leg strap 1006 and augments the normal force and pressure exerted on the front and back of leg 1001.

The increased normal force together with the increased coefficient of friction of a properly selected foam padding increases the ability for the cantilever leg anchor 1002 and leg strap from sliding down the leg, while not proportionately increasing the constrictive side forces on the leg from leg strap 1006 upon the medial and lateral aspects of leg 1001. Therefore, the unit has a better likelihood of supporting force without slipping, and the amount of cinching force is significantly reduced, thereby helping to preserve vascular flow and reduce the risk of cramping and muscle pain. The solution can also work without the cantilever leg anchor 1002 by just securing spring element 1003 directly to leg strap 1006. However, there is a higher likelihood of the leg strap 1006 sliding down a user's leg. There is also a significant loss of moment arm at large plantarflexion angles without the cantilever, reducing the torque that the system can generate. Since the leg has the least ability to generate ankle torque when at full plantar flexion, it makes this solution undesirable also because of the reduction of assistive torque because or a loss of normal (orthogonal) force because the spring is mounted too close to the axis of rotation of the ankle joint. The cantilever improves the normal (orthogonality) of the direction in which the spring element 1003 reaches the flipper 1004.

Said means of securement 1005 that anchors spring element 1003 to flipper 1004 can be accomplished in a wide variety of ways. In one example a U shaped anchor 1009 can accept spring element 1003 and distribute forces across a greater width of the flipper helping to prevent the flipper from deforming or buckling under load.

I claim:

1. A method of using an exoskeleton, the method comprising:
    attaching a base of the exoskeleton to a user's foot, the base comprising a flipper and a yoke;
    attaching the yoke to the user's leg above the user's ankle and below the user's knee;
    applying force to the yoke with the user's leg; and
    applying a dorsiflexion assisting torque between the yoke and the flipper with at least one spring in response to the force applied to the yoke with the user's leg.

2. The method of claim 1, further comprising rotating the yoke in a sagittal plane of the user relative to the flipper in response to the applied force.

3. The method of claim 2, wherein rotating the yoke in the sagittal plane comprises rotating the yoke about a rotatable connection between the yoke and the base, wherein an axis of rotation of the rotatable connection is approximately aligned with an axis of rotation of the user's ankle in the sagittal plane of the user when the base is attached to the user's foot.

4. The method of claim 3, wherein the at least one spring includes at least one spring spoke configured to maintain at least a portion of the at least one spring at a predetermined radial distance from the axis of rotation of the user's ankle when the base is attached to the user's foot.

5. The method of claim 3, wherein the rotatable connection is a living hinge.

6. The method of claim 1, further comprising rotating the flipper relative to the yoke to transition between a land mode, where the flipper is configured to be passive, and a swim mode, where the flipper is configured to supplement a user's swimming stroke.

7. The method of claim 6, wherein applying force to the yoke comprises applying force to the yoke with a back of the user's leg in the swim mode.

8. The method of claim 1, wherein the at least one spring comprises a dorsiflexion spring, and further comprising applying the dorsiflexion assisting torque between the yoke and the flipper with the dorsiflexion spring when the flipper is in a swim mode, and applying a plantarflexion assisting torque to the base with a plantarflexion spring when the flipper is in a land mode.

9. The method of claim 1, wherein the yoke and the flipper are connected with a rotatable connection.

10. The method of claim 1, wherein the at least one spring includes an elastomeric sheet extending between the flipper and the yoke.

11. The method of claim 1, wherein the at least one spring includes a plurality of portions with different spring rates.

12. The method of claim 1, wherein the yoke includes a lateral yoke stanchion, a medial yoke stanchion, and a bridge extending between the lateral yoke stanchion and the medial yoke stanchion.

13. The method of claim 1, wherein the at least one spring is integrally formed with at least one selected from the base, the yoke, and the flipper.

14. The method of claim 1, wherein the at least one spring is connected to the flipper and the yoke.

15. A method of using an exoskeleton, the method comprising:
    attaching a base of the exoskeleton to a user's foot, the base comprising a flipper and a yoke configured to be attached to the user's leg above the user's ankle and below the user's knee;
    rotating the flipper between a swim mode and a land mode, wherein the flipper is disposed adjacent to the base in the swim mode and adjacent to the yoke and/or the user's shin in the land mode;
    applying force to the yoke with the user's leg;
    rotating the yoke in a sagittal plane of the user relative to the flipper in response to the applied force; and
    applying a dorsiflexion assisting torque between the yoke and the flipper with at least one spring in response to the force applied to the yoke with the user's leg when the flipper is in the swim mode;
    wherein rotating the yoke in the sagittal plane comprises rotating the yoke about a rotatable connection between the yoke and the base, wherein an axis of rotation of the rotatable connection is approximately aligned with an axis of rotation of the user's ankle in the sagittal plane of the user when the base is attached to the user's foot.

16. The method of claim 15, wherein applying force to the yoke comprises applying force to the yoke with a back of the user's leg in the swim mode.

17. The method of claim 15, wherein the at least one spring comprises a dorsiflexion spring, and further comprising applying the dorsiflexion assisting torque between the yoke and the flipper with the dorsiflexion spring when the flipper is in the swim mode, and applying a plantarflexion assisting torque to the base with a plantarflexion spring when the flipper is in the land mode.

18. The method of claim 15, wherein the yoke and the flipper are connected with a rotatable connection.

19. The method of claim 18, wherein the rotatable connection is a living hinge.

20. The method of claim 15, wherein the at least one spring includes an elastomeric sheet extending between the flipper and the yoke.

21. The method of claim 15, wherein the at least one spring includes at least one spring spoke configured to maintain at least a portion of the at least one spring at a predetermined radial distance from the axis of rotation of the user's ankle when the base is attached to the user's foot.

22. The method of claim 15, wherein the at least one spring includes a plurality of portions with different spring rates.

23. The method of claim 15, wherein the yoke includes a lateral yoke stanchion, a medial yoke stanchion, and a bridge extending between the lateral yoke stanchion and the medial yoke stanchion.

24. The method of claim 15, wherein the at least one spring is integrally formed with at least one selected from the base, the yoke, and the flipper.

25. The method of claim 15, wherein the at least one spring is connected to the flipper and the yoke.

\* \* \* \* \*